United States Patent
Han et al.

(10) Patent No.: US 7,929,372 B2
(45) Date of Patent: Apr. 19, 2011

(54) DECODER, MEMORY SYSTEM, AND PHYSICAL POSITION CONVERTING METHOD THEREOF

(75) Inventors: Yong-Joo Han, Seongnam-si (KR); Dong-Jin Lee, Seoul (KR); Kwang-Choi Choe, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 183 days.

(21) Appl. No.: 12/219,600

(22) Filed: Jul. 24, 2008

(65) Prior Publication Data

US 2008/0285346 A1 Nov. 20, 2008

Related U.S. Application Data

(63) Continuation-in-part of application No. 12/007,855, filed on Jan. 16, 2008, now Pat. No. 7,830,742.

(30) Foreign Application Priority Data

Jan. 25, 2007 (KR) .................. 10-2007-0008029

(51) Int. Cl.
*G11C 8/00* (2006.01)

(52) U.S. Cl. .............. 365/230.06; 365/230.03; 365/236; 365/230.01

(58) Field of Classification Search ............. 365/230.01, 365/230.03, 230.06, 236
See application file for complete search history.

(56) References Cited

U.S. PATENT DOCUMENTS

| | | | | |
|---|---|---|---|---|
| 4,716,586 A | * | 12/1987 | Bauer | 711/163 |
| 5,479,640 A | * | 12/1995 | Cartman et al. | 711/111 |
| 5,715,193 A | * | 2/1998 | Norman | 365/185.02 |
| 5,765,219 A | * | 6/1998 | Densham et al. | 711/220 |
| 5,890,105 A | * | 3/1999 | Ishihara et al. | 704/201 |
| 5,946,239 A | | 8/1999 | Honma | |
| 6,035,377 A | * | 3/2000 | James et al. | 711/147 |
| 6,070,238 A | * | 5/2000 | Feiste et al. | 712/217 |
| 6,157,585 A | | 12/2000 | Kim | |
| 6,201,733 B1 | | 3/2001 | Hiraki et al. | |
| 6,259,646 B1 | * | 7/2001 | Huber | 365/230.01 |
| 6,345,001 B1 | * | 2/2002 | Mokhlesi | 365/185.33 |
| 6,586,823 B2 | | 7/2003 | Ohmura et al. | |
| 6,898,668 B2 | * | 5/2005 | Thompson et al. | 711/114 |
| 6,993,690 B1 | | 1/2006 | Okamoto | |
| 7,096,341 B1 | * | 8/2006 | DeTar et al. | 711/210 |
| 7,113,432 B2 | * | 9/2006 | Mokhlesi | 365/185.33 |
| 7,406,576 B2 | * | 7/2008 | Asauchi | 711/163 |
| 7,434,122 B2 | * | 10/2008 | Jo | 714/723 |
| 7,447,936 B2 | * | 11/2008 | Shiota et al. | 714/5 |
| 7,472,252 B2 | * | 12/2008 | Ben-Zvi | 711/203 |
| 2006/0092725 A1 | | 5/2006 | Min et al. | |

FOREIGN PATENT DOCUMENTS

| | | |
|---|---|---|
| JP | 10-283787 | 10/1998 |
| JP | 2003-059288 | 2/2003 |
| KR | 10-2000-0003987 A | 1/2000 |
| KR | 10-2000-0035149 A | 6/2000 |
| KR | 10-2006-0038667 A | 5/2006 |

* cited by examiner

*Primary Examiner* — Viet Q Nguyen
(74) *Attorney, Agent, or Firm* — Lee & Morse, P.C.

(57) ABSTRACT

A decoder, a memory system, and a physical position converting method thereof may detect whether an address count of an input address is equal to or greater than a predetermined value. A physical position of a semiconductor memory device corresponding to the input address may be converted if the address count is equal to or greater than the predetermined value.

16 Claims, 21 Drawing Sheets

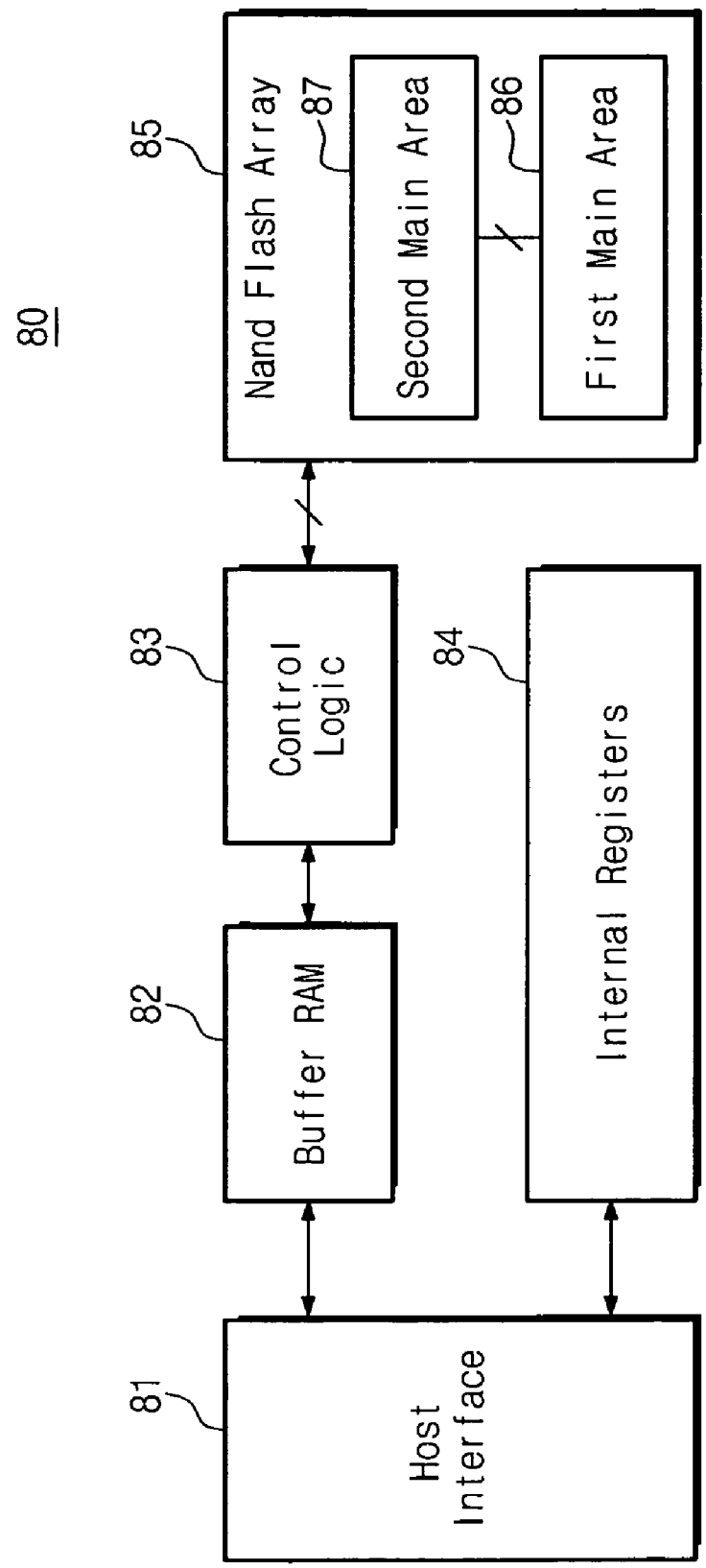

DECODER, MEMORY SYSTEM, AND PHYSICAL POSITION CONVERTING METHOD THEREOF

CROSS-REFERENCE TO RELATED APPLICATION

The present application is a continuation-in-part application of co-pending U.S. patent application Ser. No. 12/007,855, entitled, "Semiconductor Memory Device and Memory Cell Accessing Method Thereof," which was filed on Jan. 16, 2008, now U.S. Pat. No. 7,830,742 the entire contents of which are hereby incorporated by reference.

BACKGROUND

1. Field of the Invention

Embodiments relate to a decoder configured to convert a physical position of a semiconductor memory device according to an address count, a memory system, and a physical position converting method thereof.

2. Description of the Related Art

Memory devices are semiconductor devices storing readable data. Memory device are classified into a volatile memory device and a nonvolatile memory device.

Volatile memory devices lose data when powered off. However, since volatile memory devices are readily rewritable, they are convenient for use as a temporary storage for an operating system and an application program. Examples of volatile memory devices include static RAMs (SRAMs) and dynamic RAMs (DRAMs).

Nonvolatile memory devices retain data even when powered off. However, nonvolatile memory devices require an erase cycle before storing new data. Examples of nonvolatile memory devices include NAND flash memories, NOR flash memories, EEPROMs, EPROMs, ROMs, mask ROMs (MROMs), programmable ROMs (PROMs), and ferroelectric RAMs (FRAMs).

SUMMARY

Embodiments are therefore directed to a decoder for a semiconductor memory device, a memory system, and a physical position converting method thereof, which substantially overcome one or more of the problems due to the limitations and disadvantages of the related art.

Embodiments of a decoder for a semiconductor memory device, a memory system, and a physical position converting method may increase reliability of the memory cells.

At least one of the above and other advantages may be realized by providing a decoder including a detector configured to detect whether an address count of an input address is equal to or greater than a predetermined value, and a physical position converter configured to convert a physical position of a semiconductor memory device corresponding to the input address if the address count is equal to or greater than the predetermined value.

In some embodiments, the detector may use address count information stored in the semiconductor memory device to detect whether the address count is equal to or greater than the predetermined value.

In other embodiments, the address count information may be stored in a nonvolatile memory.

In further embodiments, the address count may be an input count of the input address.

In still further embodiments, the address count may include an operation count of the physical position corresponding to the input address.

In still further embodiments, the semiconductor memory device may be a NAND flash memory, and the operation count may be one of a program operation count, a read operation count, and an erase operation count.

In still further embodiments, the program operation count may be stored in memory cells connected to each word line.

In still further embodiments, the semiconductor memory device may include a memory area used when the address count is equal to or greater than the predetermined value, and another memory area used when the address count is smaller than the predetermined value.

At least one of the above and other advantages may be realized by providing a semiconductor memory device including a first main area and a second main area, and a memory controller configured to control the semiconductor memory device, to detect whether an address count of an input address is equal to or greater than a predetermined value, and to determine whether a physical position of the semiconductor memory device corresponding to the input address is the first main area or the second main area.

In some embodiments, the first main area may be a memory area used when the address count is smaller than the predetermined value, and the second main area may be a memory area used when the address count is equal to or greater than the predetermined value.

In other embodiments, the memory controller may be configured to store address count information.

In further embodiments, the semiconductor memory device may be a nonvolatile memory device and may be configured to store address count information.

In still further embodiments, the memory controller may be configured to read, in a test mode, the address count information stored in the semiconductor memory device and to convert a physical position corresponding to an address whose address count is equal to or greater than the predetermined value.

In still further embodiments, the memory controller may be configured to read, in a power-up mode, the address count information stored in the semiconductor memory device and to convert a physical position corresponding to an address whose address count is equal to or greater than the predetermined value.

In still further embodiments, the memory controller may include an address detector configured to detect whether the address count of the input address is equal to or greater than the predetermined value and to output the detection results; and a physical position converter may be configured to convert the physical position corresponding to the input address from the first main area to the second main area according to the output of the address detector.

In still further embodiments, the semiconductor memory device may be a NAND flash memory, and the first main area and the second main area may share a word line.

In still further embodiments, the address count may include one of a program operation count, a read operation count, and an erase operation count.

In still further embodiments, the memory controller may be configured to perform wear leveling when the address count is equal to or greater than the predetermined value, wear leveling including converting the physical position corresponding to the input address into a non-operated physical position or a less-operated physical position. The predetermined value may be a value just before the wear of a physical position.

In still further embodiments, the memory controller may be configured to perform wear leveling when the address count is equal to or greater than a first use maintenance value, wear leveling including converting the physical position corresponding to the input address into a non-operated physical position or a physical position operated less than the first use maintenance value, wherein, when the address counts of all physical positions are equal to or greater than first maintenance value and the address count corresponding to the input address is equal to or greater than a second maintenance value, wear leveling including converting the physical position corresponding to the input address into a physical position operated less than the second use maintenance value. The first and second use maintenance values maybe values before wear-out of the physical position, and the second use maintenance value may be greater than the first use maintenance value.

At least one of the above and other advantages may be realized by providing a memory system including a volatile memory device including a first main area and a second main area, a nonvolatile memory device configured to store address count information, and a controller configured to control the volatile memory device and the nonvolatile memory device, to read the address count information of the nonvolatile memory device, and to convert a physical position of the first main area corresponding to an input address to a physical position of the second main area if the address count is equal to or greater than a predetermined value.

At least one of the above and other advantages may be realized by providing a method for converting a physical position of a semiconductor memory device includes determining whether an address count of an input address is equal to or greater than a predetermined value, and converting a physical position of the semiconductor memory device corresponding to the input address if the address count is equal to or greater than the predetermined value.

In some embodiments, the address count may be an input count of the input address and is stored inside the semiconductor memory device.

In other embodiments, the address count may be an operation count of the physical position corresponding to the input address and may be stored inside the semiconductor memory device.

In further embodiments, the address count may be stored outside the semiconductor memory device.

In still further embodiments, if the address count is equal to or greater than the predetermined value, a physical position with the smallest address count in the semiconductor memory device may be detected and the physical position corresponding to the input address may be converted to the detected physical position.

BRIEF DESCRIPTION OF THE DRAWINGS

The above and other features and advantages will become more apparent to those of ordinary skill in the art by describing in detail exemplary embodiments with reference to the attached drawings, in which:

FIG. 21 illustrates a OneNAND flash memory according to an embodiment of the present invention.

DETAILED DESCRIPTION

Korean Patent Application No. 10-2007-0008029, filed on Jan. 25, 2007, in the Korean Intellectual Property Office, and entitled: "Semiconductor Memory Device and Memory Cell Accessing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Decoders and memory systems of embodiments are configured to convert a physical position of a semiconductor memory device corresponding to an address according to an address count. Herein, the address count may be the number of times the address is input (or accessed) or the number of times an operation is performed at the physical position corresponding to the address, which will be described in detail below. If the address count is equal to or greater than a predetermined value, embodiments may convert the physical position corresponding to the input address, thereby improving the reliability of the semiconductor memory device.

Figure 1:
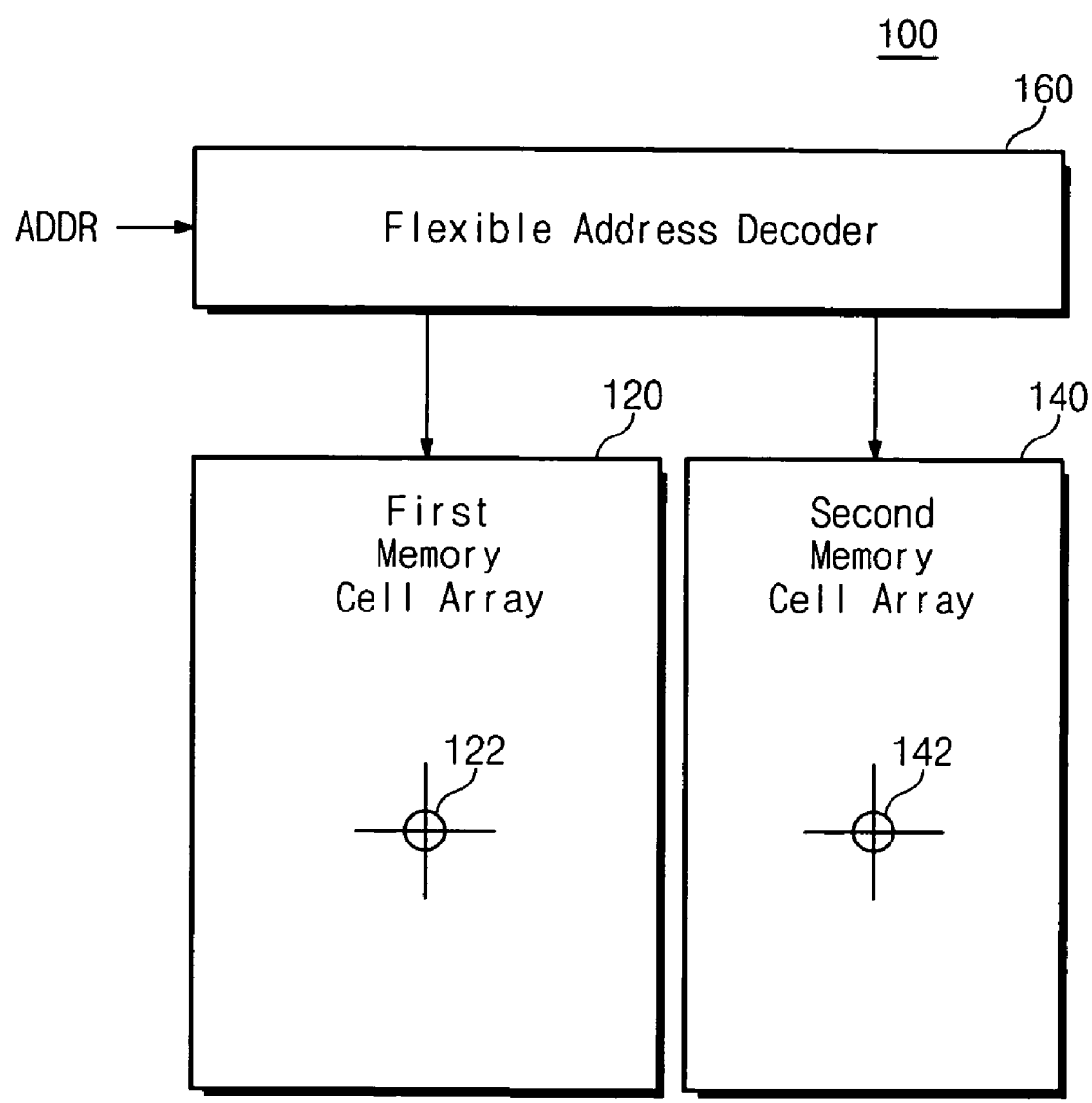
FIG. 1 illustrates a block diagram of a semiconductor memory device according to an embodiment.

FIG. 1 illustrates a semiconductor memory device 100 according to an embodiment of the present invention. Referring to FIG. 1, the semiconductor memory device 100 may include a first memory cell array 120, a second memory cell array 140, and a flexible address decoder 160.

The flexible address decoder 160 may determine whether to include a memory cell corresponding to an input address ADDR in the first memory cell array 120 or in the second memory cell array 140 according to an address count of the input address ADDR. Herein, for the sake of descriptive convenience, the address count will be limited to the number of times of address input (or access) in the semiconductor memory device 100.

If a memory cell 122 of the first memory cell array 120 corresponding to the input address ADDR is accessed a predetermined number of times or more, the flexible address decoder 160 may convert the physical memory cell corresponding to the input address ADDR from the memory cell 122 of the first memory cell array 120 to a memory cell 142 of the second memory cell array 140.

The first memory cell array 120 may include memory cells used when an address input count is less than a predetermined value, while the second memory cell array 140 may include memory cells used when the address input count is equal to or greater than the predetermined value. However, it will be readily understood by those skilled in the art that the first and second memory cell arrays 120 and 140 are not limited to the above configurations. For example, each of the first and second memory cell arrays 120 and 140 may include corresponding memory cells in which the address input count is equal to or greater than the predetermined value. That is, the second memory call array 140 may include a memory cell corresponding to the memory cell of the first memory cell array 120 accessed a predetermined number of times or more, and the first memory call array 120 may include a memory cell corresponding to the memory cell of the second memory cell array 140 accessed the predetermined number of times or more.

As described above, the semiconductor memory device 100 may include the flexible address decoder 160 that converts the physical position of the memory cell corresponding to the input address ADDR if the address input count is equal to or greater than the predetermined value. The semiconductor memory device 100 may use the flexible address decoder 160 to prevent the corresponding memory cell from being accessed the predetermined number of times or more. Thus, the semiconductor memory device 100 may improve the reliability of the memory cell.

The semiconductor memory device 100 may be a variety of memory devices. Examples of the semiconductor memory device 100 include volatile memory devices (such as RAMs, DRAMs and SRAMs) and nonvolatile memory devices (such as ROMs, FLASH memories, FRAMs and PRAMs).

Figure 2:
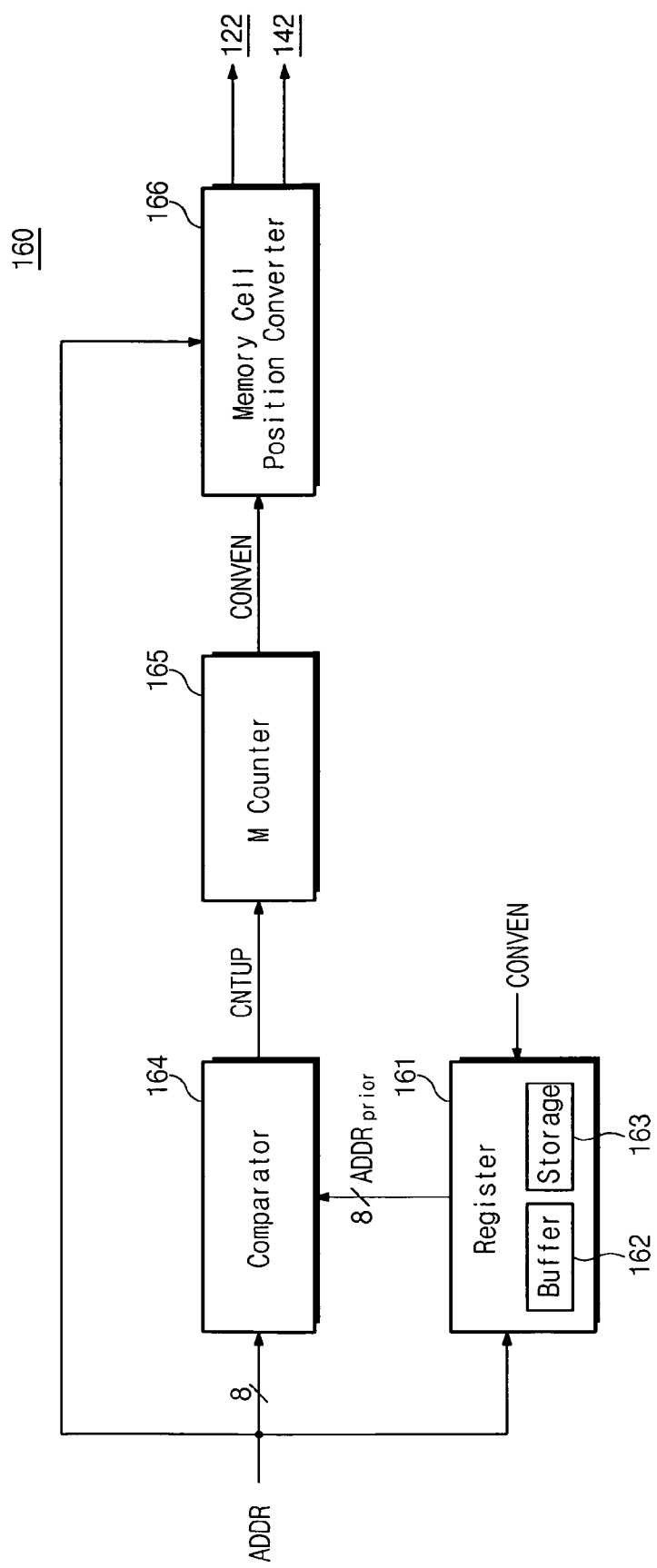
FIG. 2 illustrates a block diagram of the flexible address decoder in FIG. 1 according to an embodiment.

FIG. 2 illustrates an embodiment of the flexible address decoder 160 illustrated in FIG. 1. Referring to FIG. 2, the flexible address decoder 160 may include a register 161, an address comparator 164, a counter 165, and a memory cell position converter 166. The flexible address decoder 160 may compare a prior input address ADDRprior with an input ADDR to determine whether to convert a physical memory cell corresponding to the ADDR.

The flexible address decoder 160 may operate as follows. For the sake of descriptive convenience, it will be assumed that an 8-bit address ADDR is input to the semiconductor memory device 100. Herein, the input address ADDR is transferred to the register 161 and the address comparator 164.

The register 161 may provide the prior address ADDRprior to the address comparator 164. The register 161 may include a buffer 162 storing the input address ADDR temporarily and a storage 163 storing the prior address ADDRprior. Specifically, the initial prior address ADDRprior stored in the storage 163 of the register 161 may be an address value input when the semiconductor memory device 100 starts to operate. After the physical memory cell corresponding to the prior address ADDRprior is converted, an address stored in the buffer 162 may be stored as the prior address ADDRprior in the storage 163. More specifically, when the memory cell position is converted, the storage 163 may store the address ADDR stored in the buffer 162 in response to a logic 'high' level of a memory cell access conversion enable signal CONVEN.

If the input address ADDR is identical to the prior address ADDRprior stored in the storage 163, the buffer 162 may not store the address ADDR. On the other hand, if the input address ADDR is different from the prior address ADDRprior stored in the storage 163, the buffer 162 may store the address ADDR.

The address comparator 164 may compare the prior address ADDRprior with the input address ADDR. If the input address ADDR is identical to the prior address ADDRprior stored in the register 161, the address comparator 164 may output a count-up signal CNTUP in a logic 'high' level.

The counter 165 may perform an access count-up operation in response to the count-up signal CNTUP. If a count value is equal to or greater than a predetermined value M, the counter 165 may output the cell access conversion enable signal CONVEN in a logic 'high' level. If the count value is less than the predetermined value M, the counter 165 may output the access conversion enable signal CONVEN in a logic 'low' level. The counter 165 may include a nonvolatile memory (not illustrated) that stores the input count of the prior address ADDRprior.

In response to the access conversion enable signal CONVEN output from the counter 165, the memory cell position converter 166 may determine whether to convert a corresponding memory cell. Herein, the memory cell position converter 166 may perform an address decoding function as well. That is, in response to the access conversion enable signal CONVEN, the memory cell position converter 166 may determine whether the input address ADDR enables the memory cell 122 of the first memory cell array 120 or the memory cell 142 of the second memory cell array 140.

If the access conversion enable signal CONVEN is at a logic 'high' level, the memory cell position converter 166 may convert a physical memory cell to enable the memory cell 142 of the second memory cell array 140 according to the input address ADDR. On the other hand, if the access conversion enable signal CONVEN is at a logic 'low' level, the memory cell position converter 166 may enable the memory cell 122 of the first memory cell array 120 according to the input address ADDR.

Figure 3:
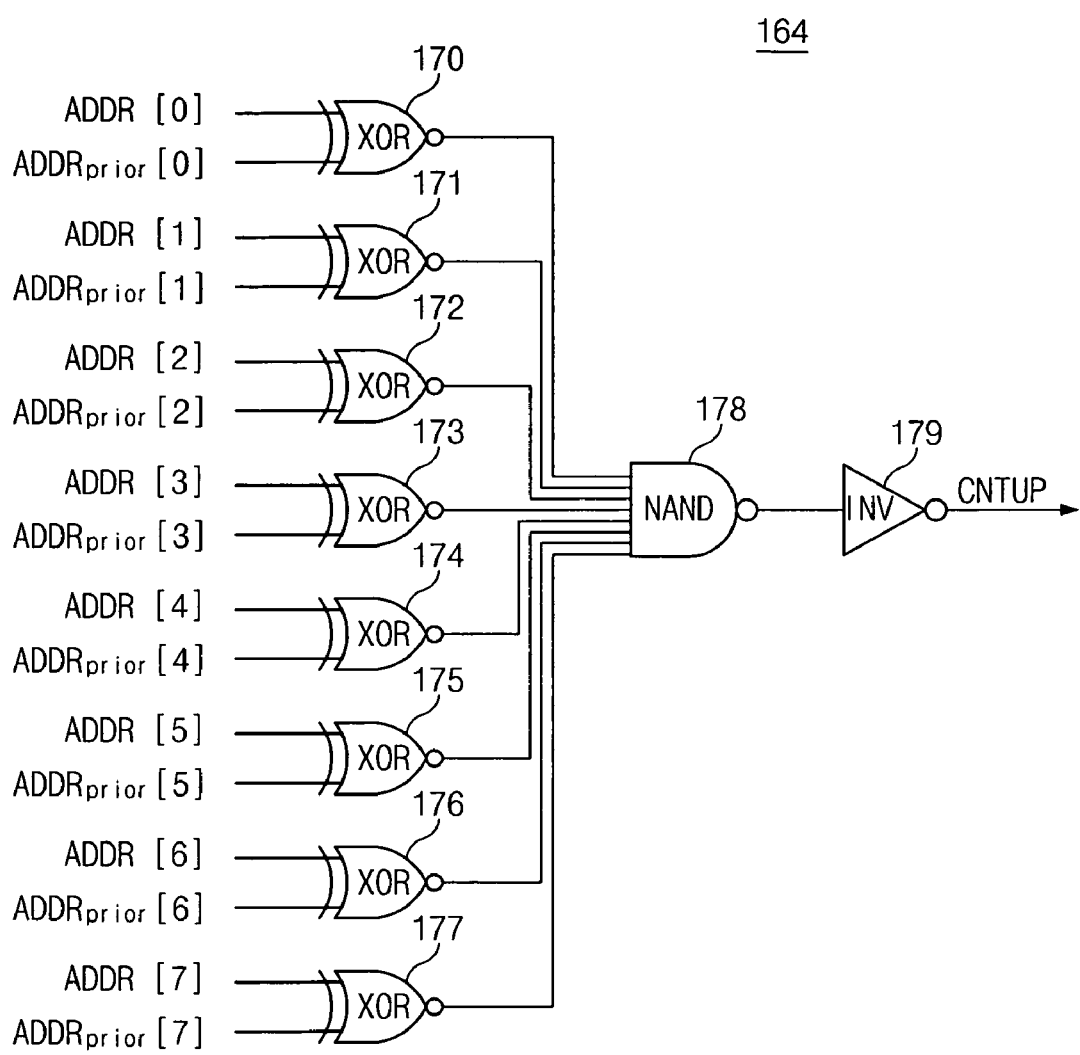
FIG. 3 illustrates a schematic diagram of the address comparator in FIG. 2 according to an embodiment.

FIG. 3 illustrates an embodiment of the address comparator 164 illustrated in FIG. 2. Referring to FIG. 3, the address comparator 164 may include seven XOR logic circuits 170 through 177, a NAND logic circuit 178, and an inverter 179.

On a bit-by-bit basis, the XOR logic circuits 170 through 177 may receive and XOR-operate the input address ADDR and the prior address ADDRprior stored in the register 161. The NAND logic circuit 178 NAND-operates the output values of the XOR logic circuits 170 through 177 and may output the results to the inverter 179. The inverter 179 inverts the output value of the NAND logic circuit 178 to generate the count-up signal CNTUP. Herein, the count-up signal CNTUP may be at a logic 'high' level only when all the addresses input to the XOR logic circuits 170 through 177 are identical.

Although it has been described that only one prior address ADDRprior is stored in the storage 163 of the register 161 illustrated in FIG. 2, those skilled in the art will readily understand that the present invention is not limited thereto. That is, a plurality of prior addresses may be stored in the storage 163. In this case, the address comparator 164 may include a plurality of comparators that determine whether the input address ADDR is identical to one of the plurality of prior addresses, to generate the count-up signal CNTUP.

Figure 4:
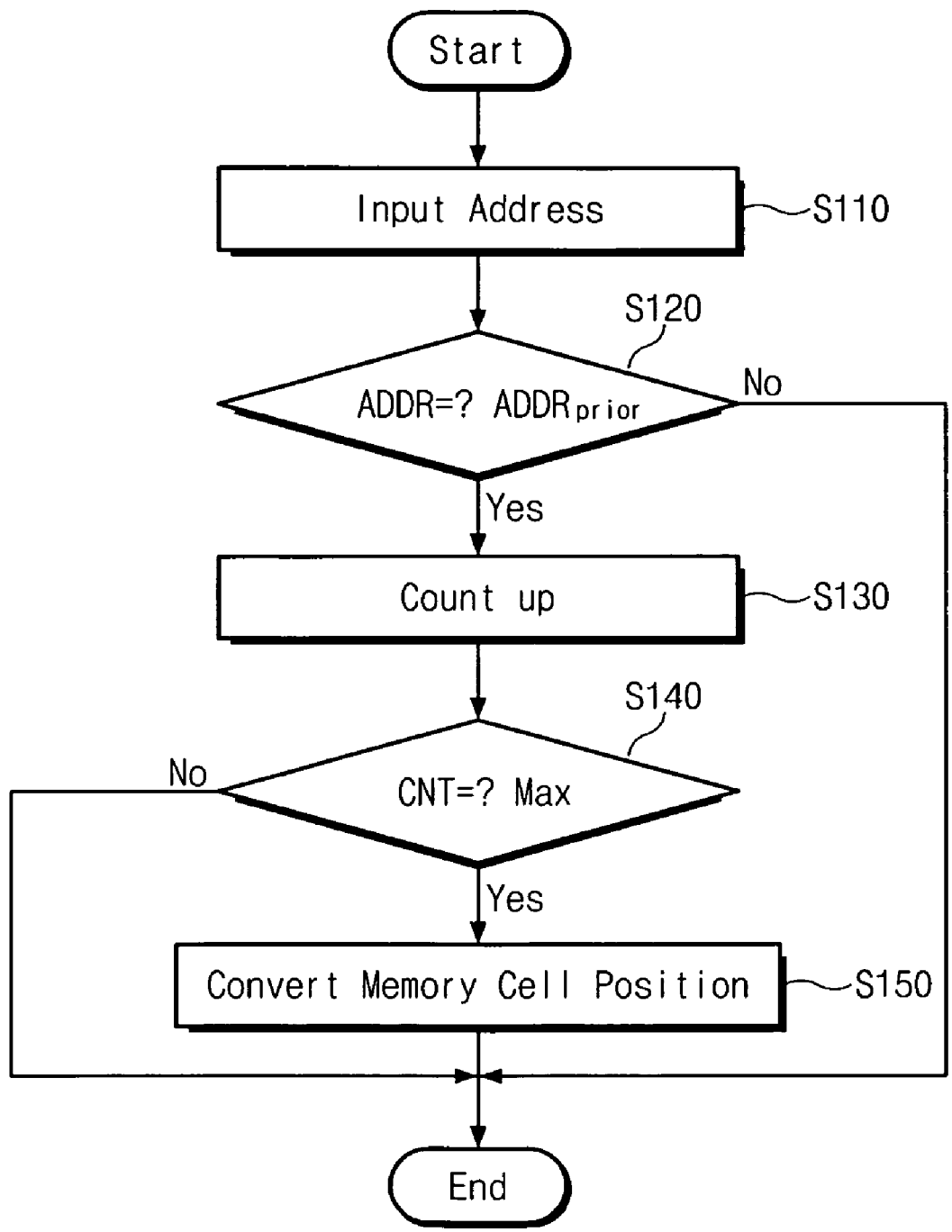
FIG. 4 illustrates a flowchart of a method for accessing a memory cell of a semiconductor memory device according to an embodiment.

FIG. 4 illustrates a flow chart of a method for converting a physical position of a memory cell corresponding to an input address according to the present invention. The physical position converting method will be described below with reference to FIGS. 1 through 4.

Referring to FIGS. 1 through 4, an input address ADDR may be input to the semiconductor memory device 100 in operation S110. The input address ADDR may be transferred to the register 161 and the address comparator 164. In operation S120, the address comparator 164 may determine whether the input address ADDR is identical to the prior address ADDRprior stored in the register 161. If the input address ADDR is identical to the prior address ADDRprior, the address comparator 164 may output the count-up signal CNTUP in a logic 'high' level, in operation S130.

On the other hand, if the input address ADDR is different from the prior address ADDRprior, the address comparator 164 may output the count-up signal CNTUP in a logic 'low' level. Also, the memory cell position converter 166 may enable the memory cell 122 of the first memory cell array 120 in response to the input address ADDR.

The counter 165 may increase a count value CNT in response to the count-up signal CNTUP output from the address comparator 164. In operation S140, the counter 165 may determine whether the count value CNT is equal to or greater than a predetermined value M. If the count value CNT is less than the predetermined value M, the counter 165 may output the access conversion enable signal CONVEN in a logic 'low' level. At this point, the memory cell position converter 166 may enable the memory cell 122 of the first memory cell array 120 in response to the access conversion enable signal CONVEN of a logic 'low' level.

On the other hand, if the count value CNT is equal to or greater than the predetermined value M, the counter 165 may output the access conversion enable signal CONVEN in a logic 'high' level. At this point, the memory cell position converter 166 may enable the memory cell 142 of the second memory cell array 140, not the memory cell 122 of the first memory cell array 120, in response to the access conversion enable signal CONVEN of a logic 'high' level. Accordingly, a physical position of an accessed memory cell accessed according to the input address ADDR may be converted in operation S150.

Figure 5:
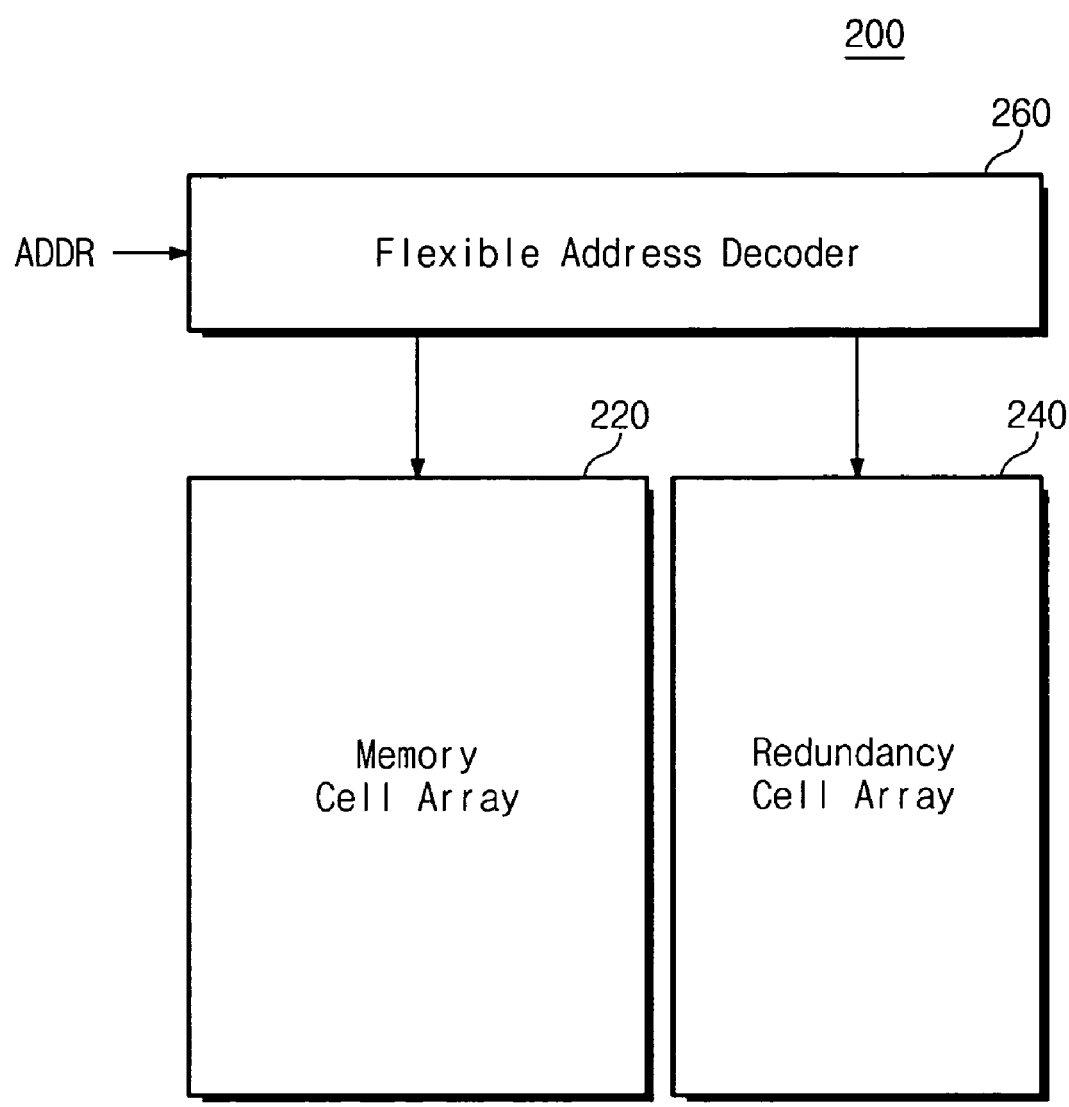
FIG. 5 illustrates a block diagram of another semiconductor memory device according to an embodiment.

FIG. 5 illustrates a semiconductor memory device 200 according to another embodiment of the present invention. Referring to FIG. 5, the semiconductor memory device 200 may include a memory cell array 220, a redundancy cell array 240, and a flexible address decoder 260. The flexible address decoder 260 may be configured to convert a physical memory cell to a memory cell of the redundancy cell array 240 when a memory cell of the memory cell array 220 corresponding to an input address ADDR is accessed a predetermined number of times or more.

Although it has been described that the semiconductor memory device 200 illustrated in FIG. 5 has one flexible address decoder corresponding to one memory cell, those skilled in the art will readily understand that the present invention is not limited thereto.

Figure 6:
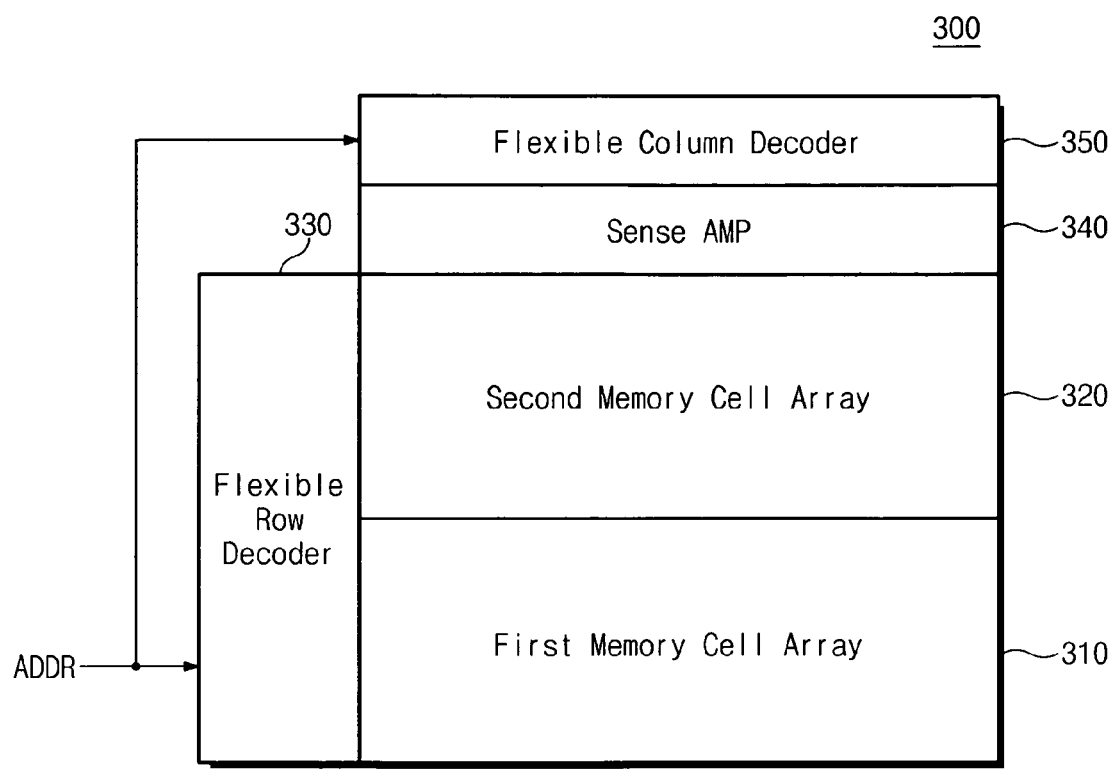
FIG. 6 illustrates a DRAM device according to an embodiment of the present invention.

FIG. 6 illustrates a semiconductor memory device 300 according to yet another embodiment of the present invention, which is also applicable to a DRAM device. Referring to FIG. 6, the semiconductor memory device 300 may include a first memory cell array 310, a second memory cell array 320, a flexible row decoder 330, a sense amplifier 340, and a flexible column decoder 350.

Each of the first and second memory cell arrays 310 and 320 may include DRAM memory cells. The first memory cell array 310 may include memory cells whose addresses have been accessed less than a predetermined number of times, and the second memory cell array 320 may include memory cell whose addresses have been accessed the predetermined number of times or more.

The flexible row decoder 330 may retrieve and store an input count of a row address of the input address ADDR. The flexible column decoder 350 may retrieve and store an input count of a column address of the input address ADDR. The flexible row decoder 330 and the flexible column decoder 350 may be embodied using the flexible address decoder 160 illustrated in FIG. 2.

The flexible row decoder 330 may convert a row line that is enabled to include a memory cell corresponding to a row address in the second memory cell array 320, not the first memory cell array 310, if a row address input count of the input address ADDR is equal to or greater than a predetermined value. The flexible column decoder 350 may convert a column line that is enabled to include a memory cell corresponding to a column address in the second memory cell array 320, not the first memory cell array 310, if a column address input count of the input address ADDR is equal to or greater than a predetermined value.

The flexible row decoder 330 and the flexible column decoder 350 may be configured to operate independently. Alternatively, the flexible row decoder 330 and the flexible column decoder 350 may be configured to operate associatively. That is, a physical position of a memory cell corresponding to the input address ADDR may be converted if the sum of the row address input count and the column address input count of the input address ADDR is equal to or greater than a predetermined value. In this case, the flexible row decoder 330 may convert a row line that is enabled to include the corresponding memory cell in the second memory cell array 320 according to a row address of the input address ADDR, and the flexible column decoder 350 may convert a column line that is enabled to include the corresponding memory cell in the second memory cell array 320 according to a column address of the input address ADDR.

The semiconductor memory device 300 illustrated in FIG. 6 is applicable to a DRAM. Also, the semiconductor memory device 300 may be applicable to any other types of memory devices that have at least one memory cell enabled across a row line and a column line.

Figure 7:
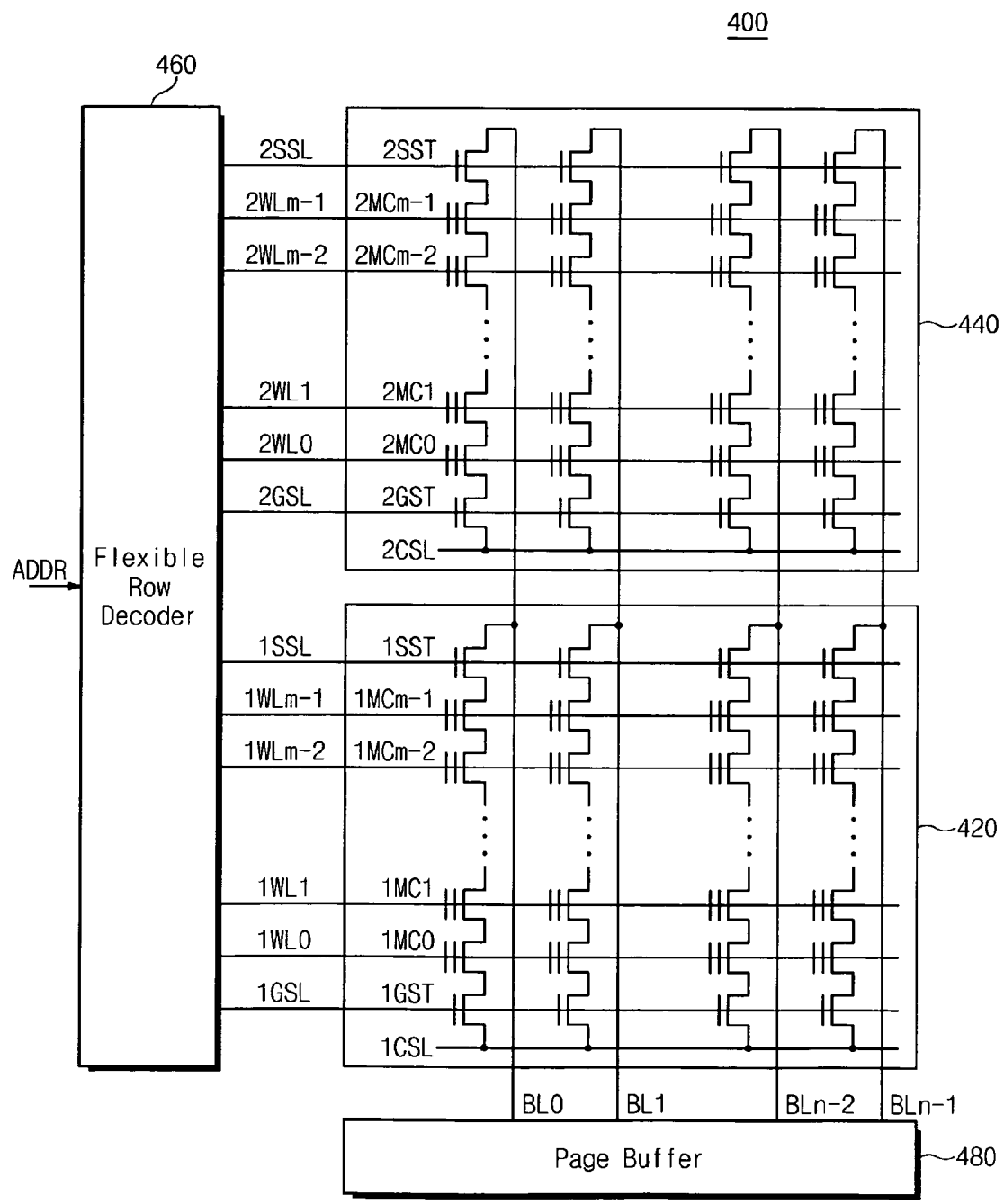
FIG. 7 illustrates a NAND flash memory device according to an embodiment of the present invention.

FIG. 7 illustrates a NAND flash memory device 400 according to an embodiment of the present invention. Referring to FIG. 7, the NAND flash memory device 400 may include a first memory cell array 420, a second memory cell array 440, a flexible row decoder 460, and a page buffer 480.

The flexible row decoder 460 may convert a physical position of a word line corresponding to an input row address ADDR according to an input count of the row address ADDR.

Herein, the flexible row decoder 460 may be embodied using the flexible address decoder 160 illustrated in FIG. 2.

The first memory cell array 420 may be a memory cell array used when an input count of the row address ADDR is less than a predetermined value. The second memory cell array 440 may be a memory cell array used when the input count of the row address ADDR is equal to or greater than the predetermined value.

The first memory cell array 420 may include a plurality of bit lines BL0 through BLn−1, a plurality of word lines 1WL0 through 1WLm−1, and a plurality of memory cells 1MC0 through 1MCm−1 disposed at the intersections of the bit lines and the word lines. The second memory cell array 440 may include a plurality of bit lines BL0 through BLn−1, a plurality of word lines 2WL0 through 2WLm−1, and a plurality of memory cells 2MC0 through 2MCm−1 disposed at the intersections of the bit lines and the word lines. The first memory cell array 420 and the second memory cell array 440 may share the bit lines BL0 through BLn−1. The first memory cell array 420 and the second memory cell array 440 may constitute one memory block. Although FIG. 7 illustrates only one memory block, the NAND flash memory device 400 may include one or more memory blocks.

Each of the memory blocks may include a plurality of cell strings of the first memory cell array 420 and a plurality of cell strings of the second memory cell array 440. As illustrated in FIG. 7, each string of the first memory cell array 420 may include a string select transistor 1SST, a ground select transistor 1GST, and the memory cells 1MC0 through 1MCm−1 connected in series between the string select transistor 1SST and the ground select transistor 1GST.

A drain of the string select transistor 1SST of each string may be connected to the corresponding bit line, and a source of the ground select transistor 1GST may be connected to a common source line 1CSL. The word lines 1WL0 through 1WLm−1 may be arranged to cross the cell strings. The word lines 1WL0 through 1WLm−1 may be connected respectively to corresponding memory cells 1MC0 through 1MCm−1 of each string. A program/read voltage may be applied to the selected word line to program/read data from the selected memory cells. The bit lines BL0 through BLn−1 may be connected electrically to the page buffer 480.

Also, as illustrated in FIG. 7, each string of the second memory cell array 440 may include a string select transistor 2SST, a ground select transistor 2GST, and the memory cells 2MC0 through 2MCm−1 connected in series between the string select transistor 2SST and the ground select transistor 2GST. A drain of the string select transistor 2SST of each string may be connected to the corresponding bit line, and a source of the ground select transistor 2GST may be connected to a common source line 2CSL.

According to the input count of the row address ADDR, the flexible row decoder 460 may determine whether the word line enabled by the row address ADDR belongs to the first memory cell array 420 or the second memory cell array 440. That is, if an input count of the row address ADDR is equal to or greater than a predetermined value, the flexible row decoder 460 may convert the word line enabled by the row address ADDR from the word line of the first memory cell array 420 to the word line of the second memory cell array 440.

In the NAND flash memory device 400 illustrated in FIG. 7, the first memory cell array 420 and the second memory cell array 440 are configured to have the same size. However, those skilled in the art will readily understand that the size of the first memory cell array 420 may be different from the size of the second memory cell array 440. For example, the second memory cell array 440 may have fewer word lines than the first memory cell array 420.

In FIG. 7, the first memory cell array 420 and the second memory cell array 440 are disposed in different well regions. However, the first memory cell array 420 and the second memory cell array 440 may be disposed in the same well region.

Figure 8:
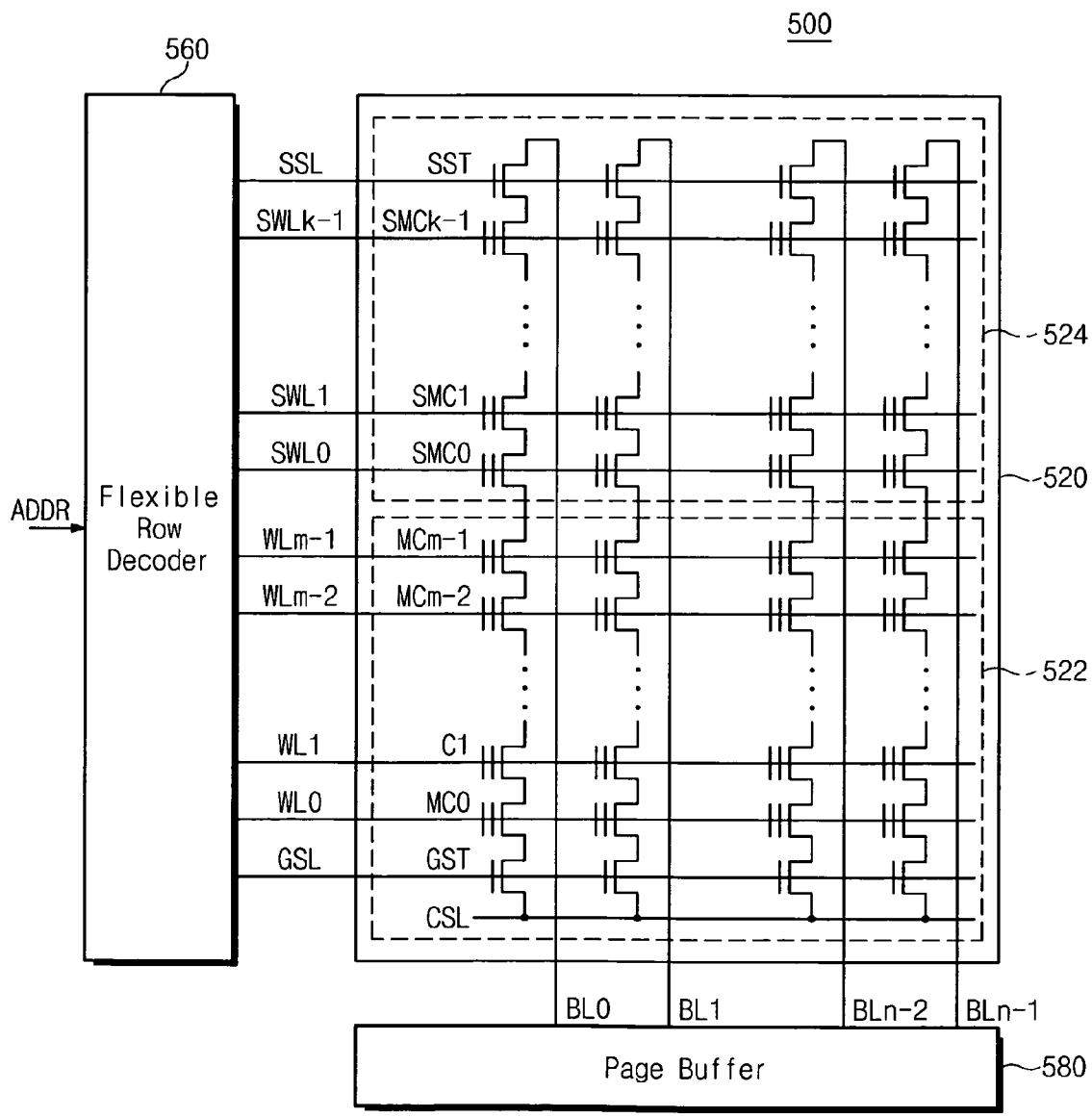
FIG. 8 illustrates a NAND flash memory device according to another embodiment of the present invention.

FIG. 8 illustrates a NAND flash memory device 500 according to another embodiment of the present invention. Referring to FIG. 8, the NAND flash memory device 500 includes a memory cell array 520. The memory cell array 520 may include a main memory cell area 522 and a spare memory cell area 524.

The main memory cell area 522 may be used when an input count of a row address ADDR is less than a predetermined value. The spare memory cell area 524 may be used when the input count of the row address ADDR is equal to or greater than the predetermined value. Herein, the main memory cell area 522 and the spare memory cell area 524 are disposed in the same well region. Specifically, the spare memory cell area 524 may include memory cells SMC0 through SMCk−1 connected to a plurality of spare word lines SWL0 through SWLk−1 on word lines WL0 through WLm−1 of the main memory cell area 522.

Although the flexible decoder in the semiconductor memory device has been described as performing an address count operation in the embodiments of FIGS. 1 through 8, embodiments are not limited thereto, as discussed below.

Figure 9:
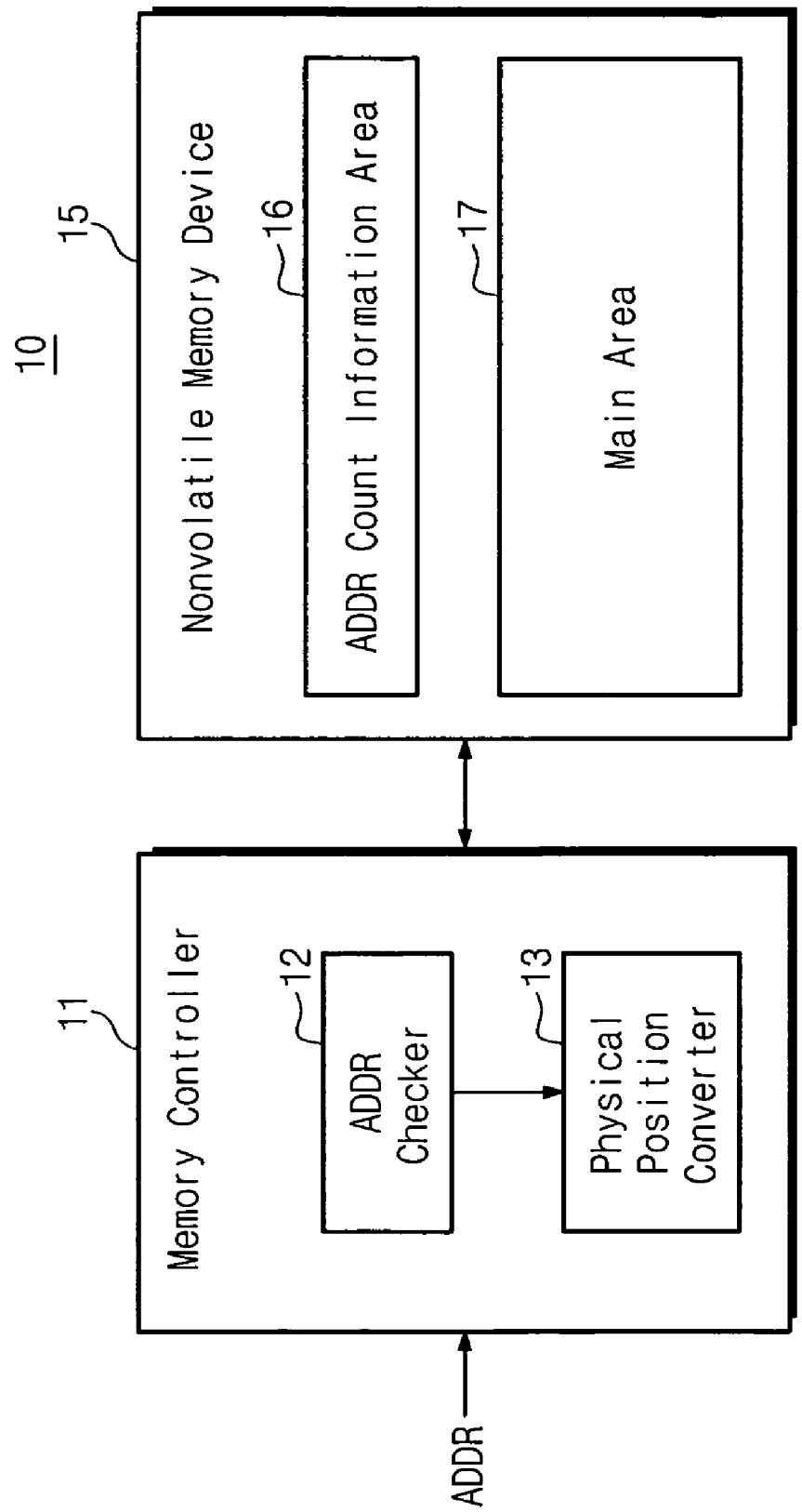
FIG. 9 illustrates a memory system according to an embodiment of the present invention.

FIG. 9 illustrates a memory system 10 according to an embodiment of the present invention. Referring to FIG. 9, the memory system 10 may include a memory controller 11 and a nonvolatile memory device 15. The memory controller 11 may perform an address input count operation and may convert a physical position of a memory cell corresponding to an input address ADDR if the count value is equal to or greater than a predetermined value.

The memory controller 11 may control an operation of the nonvolatile memory device 150. The memory controller 11 may include an address detector 12 and a physical position converter 13. The address detector 12 may count an input count of the address ADDR and may determine whether the count value is equal to or greater than a predetermined value. Meanwhile, an input count of each address may be stored in an address count information area 16 of the nonvolatile memory device 15. In a power-up mode of the memory system 10, the memory controller 11 may read an input count of each address stored in the address count information area 16 of the nonvolatile memory device 15.

The address detector 12 may perform a count-up operation on an input count of the input address ADDR read from the address count information area 16 and may enable the physical position converter 13 if the input count is equal to or greater than a predetermined value. Under the control of the address detector 12, the physical position converter 13 may convert a physical position of a memory cell of a main area 17 corresponding to the input address ADDR. The input count of the input address ADDR may be reset after the conversion of the physical position.

Meanwhile, in the power-up mode of the memory system 10, the memory controller 11 may store a new changed address input count as update information in the address count information area 16 of the nonvolatile memory device 15.

The nonvolatile memory device 15 may be embodied using a variety of nonvolatile memories. Examples of the nonvolatile memory device 15 include NAND flash memories, NOR flash memories, PRAMs, and FRAMs.

In FIG. 9, the address count information is stored in the nonvolatile memory device 15. However, the address count information may be stored in the memory controller 21.

Figure 10:
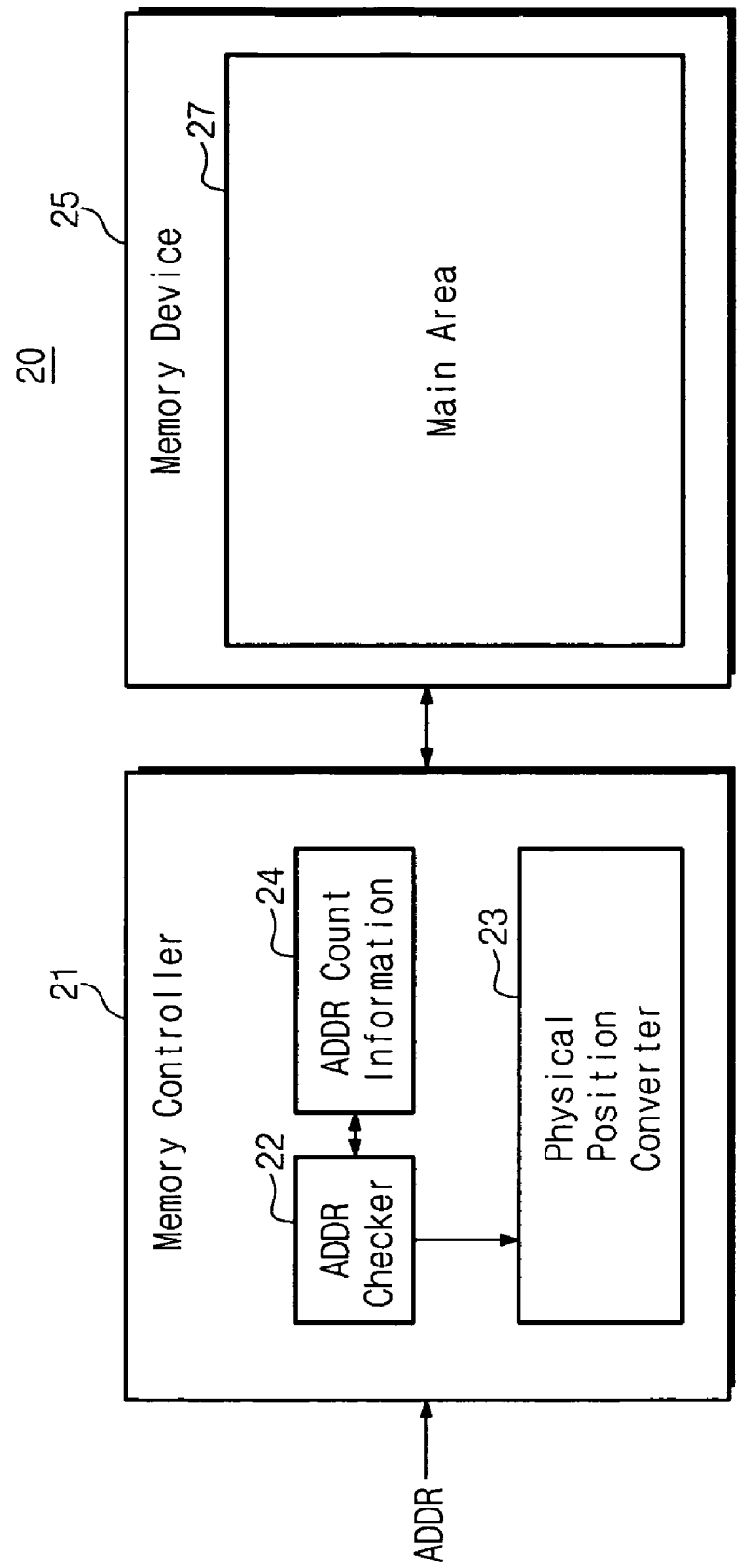
FIG. 10 illustrates a memory system according to another embodiment of the present invention.

FIG. 10 illustrates a memory system 20 according to another embodiment of the present invention. Referring to FIG. 10, the memory system 20 may include a memory device 25 and a memory controller 21 storing address count information.

The memory controller 21 may include an address detector 22, a physical position converter 23, and an address count information block 24. The address count information block 24 may store an input count of each address. When an address is input, the address detector 22 may increase an input count value of the input address read from the address count information block 24 by '1', and may determine whether the increased address input count is equal to or greater than a predetermined value. If the address input count is equal to or greater than the predetermined value, the address detector 22 may enable the physical position converter 23. The increased address input count may be stored as update information in the address count information block 24.

Under the control of the address detector 22, the physical position converter 23 may convert a physical position of a memory cell of a main area 27 of the memory device corresponding to an input address ADDR. The memory device 25 may be a volatile memory device or a nonvolatile memory device.

Although FIG. 9 illustrates that the nonvolatile memory device 15 has one main area 17, those skilled in the art will readily understand that embodiments are not limited thereto. The main area according to embodiments may be divided such that its use area is determined according to the address input count.

Figure 11:
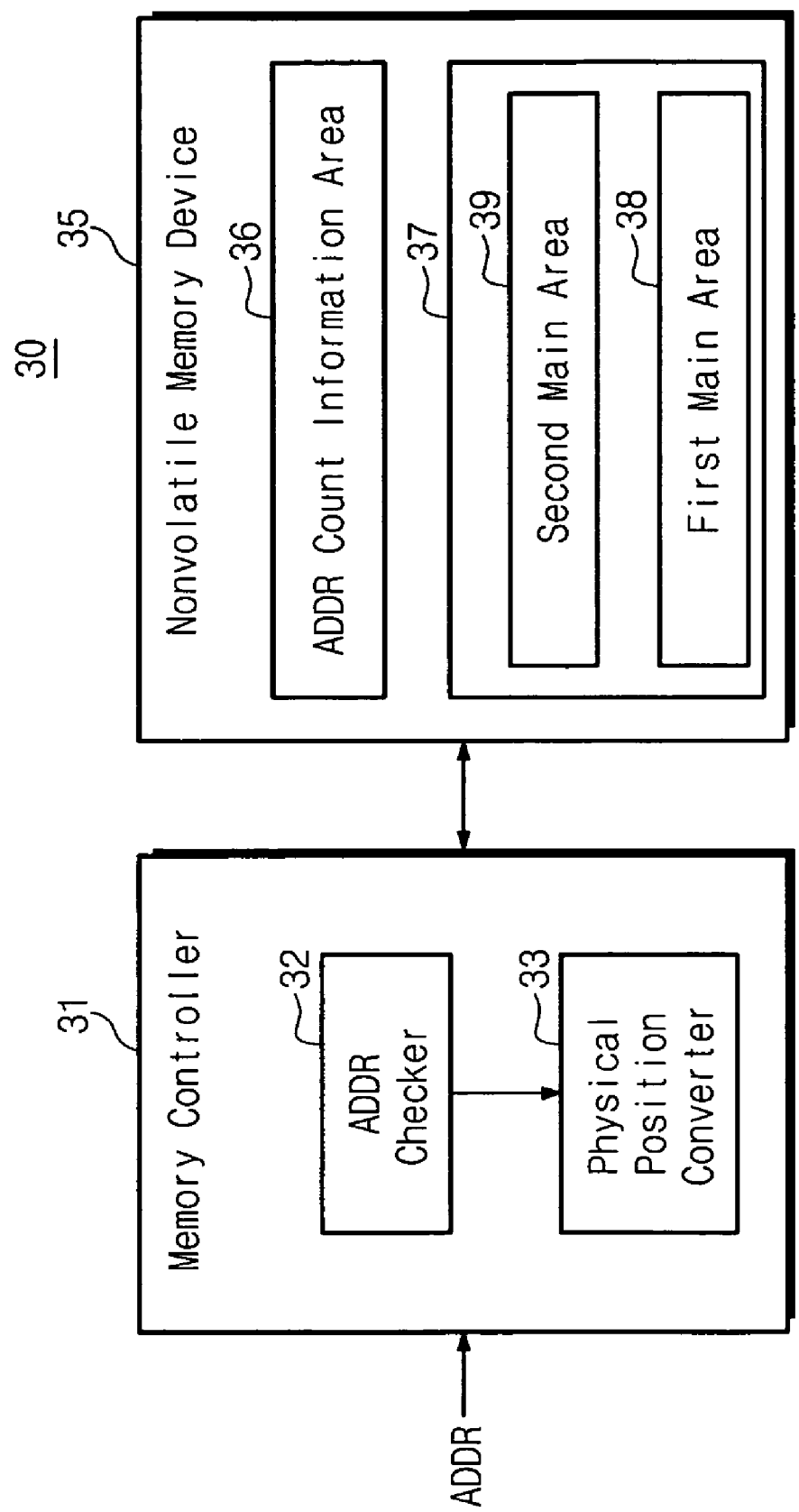
FIG. 11 illustrates a memory system according to yet another embodiment of the present invention.

FIG. 11 illustrates a memory system 30 according to yet another embodiment of the present invention. Referring to FIG. 11, the memory system 30 may include a memory controller 31 and a nonvolatile memory device 35. The memory controller 31 may include an address checker 32 and a physical position converter 33. The nonvolatile memory device 35 may include an address count information area 26 and a main area 37.

The main area 37 of a nonvolatile memory device 35 may include a first main area 38 and a second main area 39. The first main area 38 may be a memory area used when an address input count is less than a predetermined value, and the second main area 39 may be a memory area used when the address input count is equal to or greater than the predetermined value. The memory controller 31 may determine whether an input count of an input address ADDR is a predetermined value, to determine whether the main area 37 corresponding to the input address ADDR is the first main area 38 or the second main area 39.

Although FIGS. 1 through 11 illustrate that the address input count is used to determine whether to convert the physical position, those skilled in the art will readily understand that embodiments are not limited thereto. For example, the physical position may be converted according to an operation count, i.e., the number of times an operation has been performed on the physical position corresponding to the input address. In the case of a NAND flash memory, the operation count may be a program operation count, a read operation count, or an erase operation count, for example.

The program operation count and the read operation count may be processed on a page basis, and the erase operation count may be processed on a block basis. That is, in a NAND flash memory, whether to convert a physical page corresponding to a page address may be determined according to a program operation count/a read operation count corresponding to the page address, and whether to convert a physical block corresponding to a block address may be determined according to an erase operation count corresponding to the block address.

Figure 12:
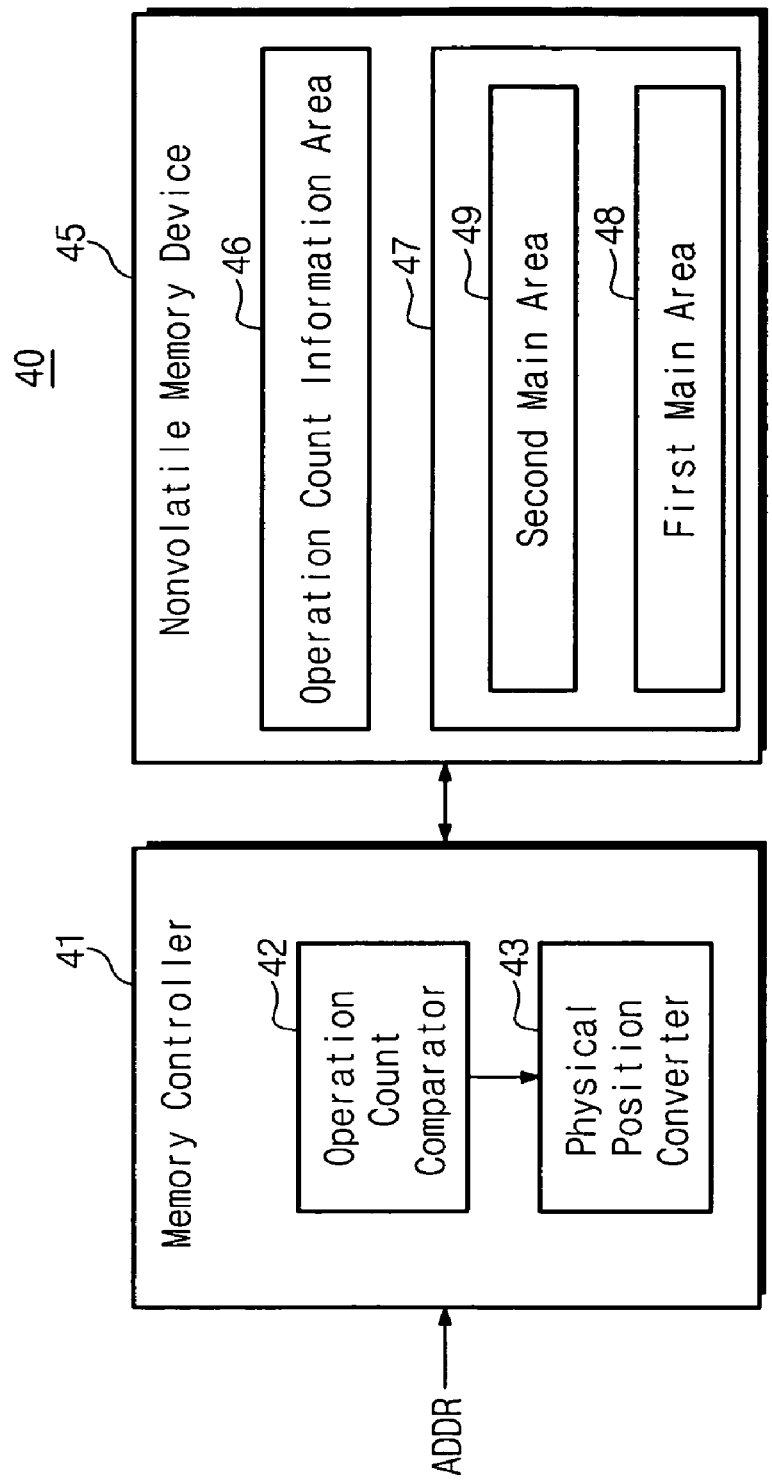
FIG. 12 illustrates a memory system according to still another embodiment of the present invention.

FIG. 12 illustrates a memory system 40 according to yet another embodiment of the present invention. Referring to FIG. 12, the memory system 40 may include a memory controller 41 and a nonvolatile memory device 45. The memory controller 41 may determine whether to convert a physical position of the nonvolatile memory device 45 corresponding to an address according to an operation count, and the nonvolatile memory device 45 may store operation count information.

The memory controller 41 may include an operation count comparator 42 and a physical position converter 43. The operation count comparator 42 may compare an operation count of a physical position corresponding to an input address, which is read from an operation count information area 46 of the nonvolatile memory device 45, with a predetermined value. If the operation count of the physical position corresponding to the input address is equal to or greater than the predetermined value, the operation count comparator 42 may enable the physical position converter 43. Under the control of the operation count comparator 42, the physical position converter 43 may convert a physical position of the nonvolatile memory device 45. For example, the physical position converter 43 may convert a physical position of a first main area 48 corresponding to the input address to a physical position of a second main area 49. Herein, the physical position may be one memory cell in the case of a DRAM and may be one word line in the case of a NAND flash memory.

If the nonvolatile memory device 45 is a NAND flash memory, the operation count may be one of a program operation count, a read operation count, and an erase operation count.

Figure 13:
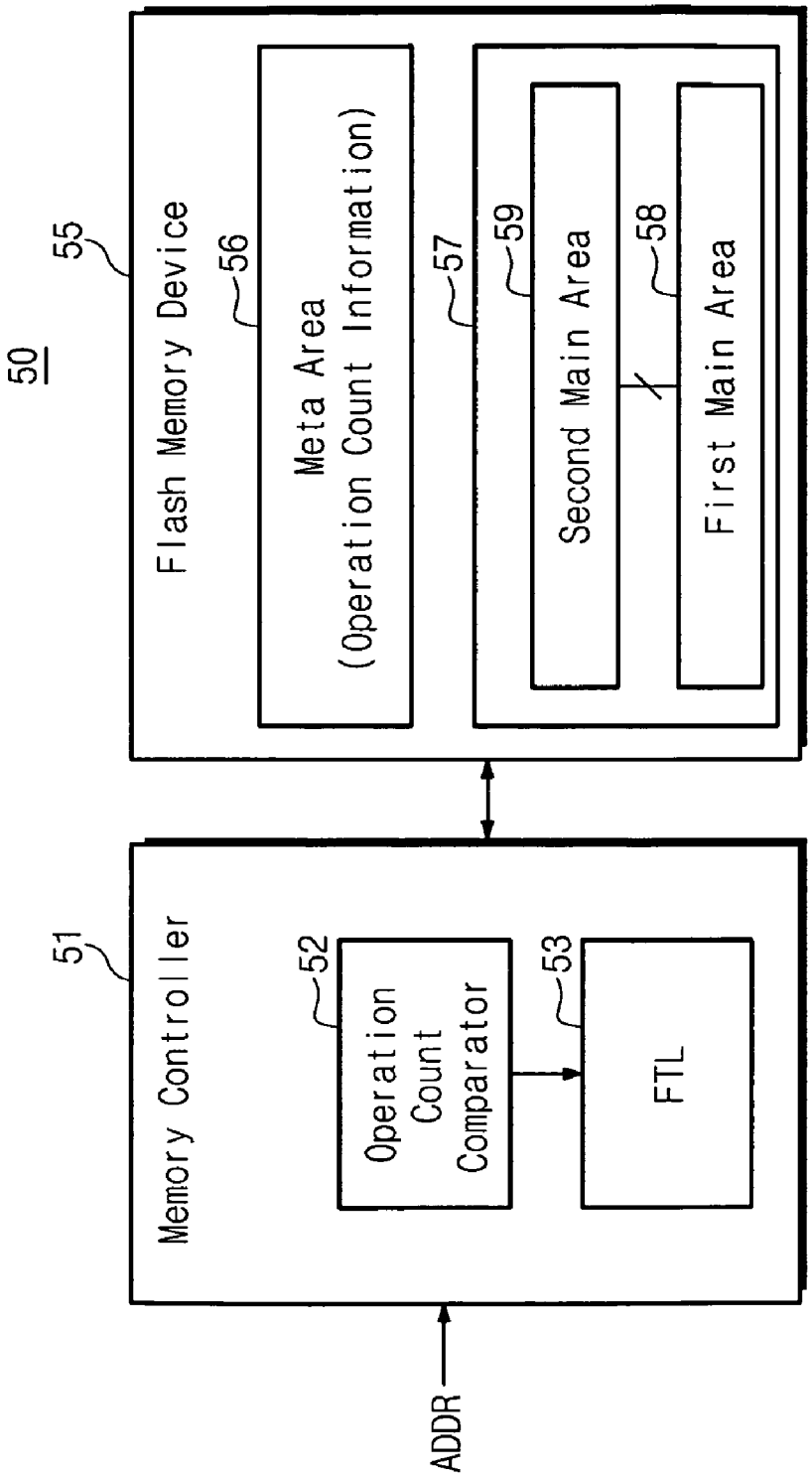
FIG. 13 illustrates a memory system according to yet another embodiment of the present invention.

FIG. 13 illustrates a memory system 50 according to still another embodiment of the present invention. Referring to FIG. 13, the memory system 50 may include a memory controller 51 and a flash memory device 55.

The memory controller 51 may include an operation count comparator 52 and a file translation layer (FTL) 53. The operation count comparator 52 may compare an operation count of a physical position corresponding to a logical address with a predetermined value, and transfer the comparison results to the FTL 53. The operation count of the physical position corresponding to the logical address may be stored in a meta area 56 of the flash memory device 55. The operation count information stored in the meta area 56 may be loaded into the memory controller 51 in a power-up operation of the memory system 50.

Based on mapping table information, the FTL 53 may convert a logical address to a physical address for a physical position of the flash memory device 55. The mapping table information may be stored in the meta area 56 of the flash memory device 55. According to the input results received from the operation count comparator 52, the FTL 53 may determine whether to convert the mapping table information. For example, if the operation count is equal to or greater than a predetermined value, the FTL 53 may convert a physical address corresponding to a logical address such that a physical location belong to a first main area 58 is converted to a physical location belonging to a second main area 59. That is, the mapping table information is converted. Herein, the converted mapping table information maybe stored as update information in the meta area 56 of the flash memory device 55.

The flash memory device 55 may include the meta area 56 and a main area 57. The meta area 56 may store control information for controlling the flash memory device 55. Specifically, the meta area 56 may store operation count information. The main area 57 may include the first main area 58 and the second main area 59. The first main area 58 may be a memory area used when the operation count is less than a predetermined value. The second main area 59 may be a memory area used when the operation count is equal to or greater than the predetermined value. If the flash memory device 55 is a NAND flash memory device, the first main area 58 may have the same structure as the first memory cell array 420 illustrated in FIG. 7 and the second main area 59 may have the same structure as the second memory cell array 440 illustrated in FIG. 7.

Also, the operation count information may be used to implement wear leveling. If the operation count information is information about an erase count of memory blocks, the FTL 53 may determine whether to perform wear leveling according to the erase count information of the memory blocks. Performing wear leveling corresponds to performing address remapping.

When the operation count information is used to indicate whether wear leveling is to be performed, embodiments may convert a physical position corresponding to a wear-out position into a non-operated physical position or a less-operated physical position. When the operation count information is used to indicate whether wear leveling is to be performed, embodiments may maintain the operation counts of all of the physical positions to be at analogous levels. For example, embodiments may maintain the operation count of the physical position corresponding to the input address at near step-by-step use maintenance values. For example, when the operation count of the physical position corresponding to the input address is equal to or greater than a first use maintenance value, the physical position corresponding to the input address may be converted a non-operated physical position or a physical position operated less than the first physical position value.

In other words, when wear leveling is performed, a less-operated physical position is operated more and a more-operated physical position is operated less. Thus, the operation counts of the overall semiconductor memory device may be equal to or less than the first use maintenance value. When the operation counts of the overall semiconductor memory device are greater than the first use maintenance value, the physical position converting may be performed with reference to a second maintenance value, greater than the first maintenance value. The first and second use maintenance values may be values set to be less than wear-out of the physical position. Thus, when wear leveling is performed, the operation counts of the overall semiconductor memory device may be equal to or less than the second use maintenance value. Therefore, embodiments may be configured to uniformly distribute the overall use frequency of the overall semiconductor memory device.

A predetermined value(s) for conversion to a new physical position may be a value just before the wear of a physical position. While two levels are discussed above, any number of use maintenance values may be employed to periodically insure wear leveling. Embodiments may use wear leveling such that a more-operated physical position is operated less and a less-operated physical position is operated more frequently. Thus, embodiments may be configured to uniformly distribute the overall use frequency of the overall semiconductor memory device.

In FIG. 13, the operation count information is stored in the meta area 56 of the flash memory device 55. However, the operation count information may be stored in the main area 57 of the flash memory device 55, as discussed below.

Figure 14:
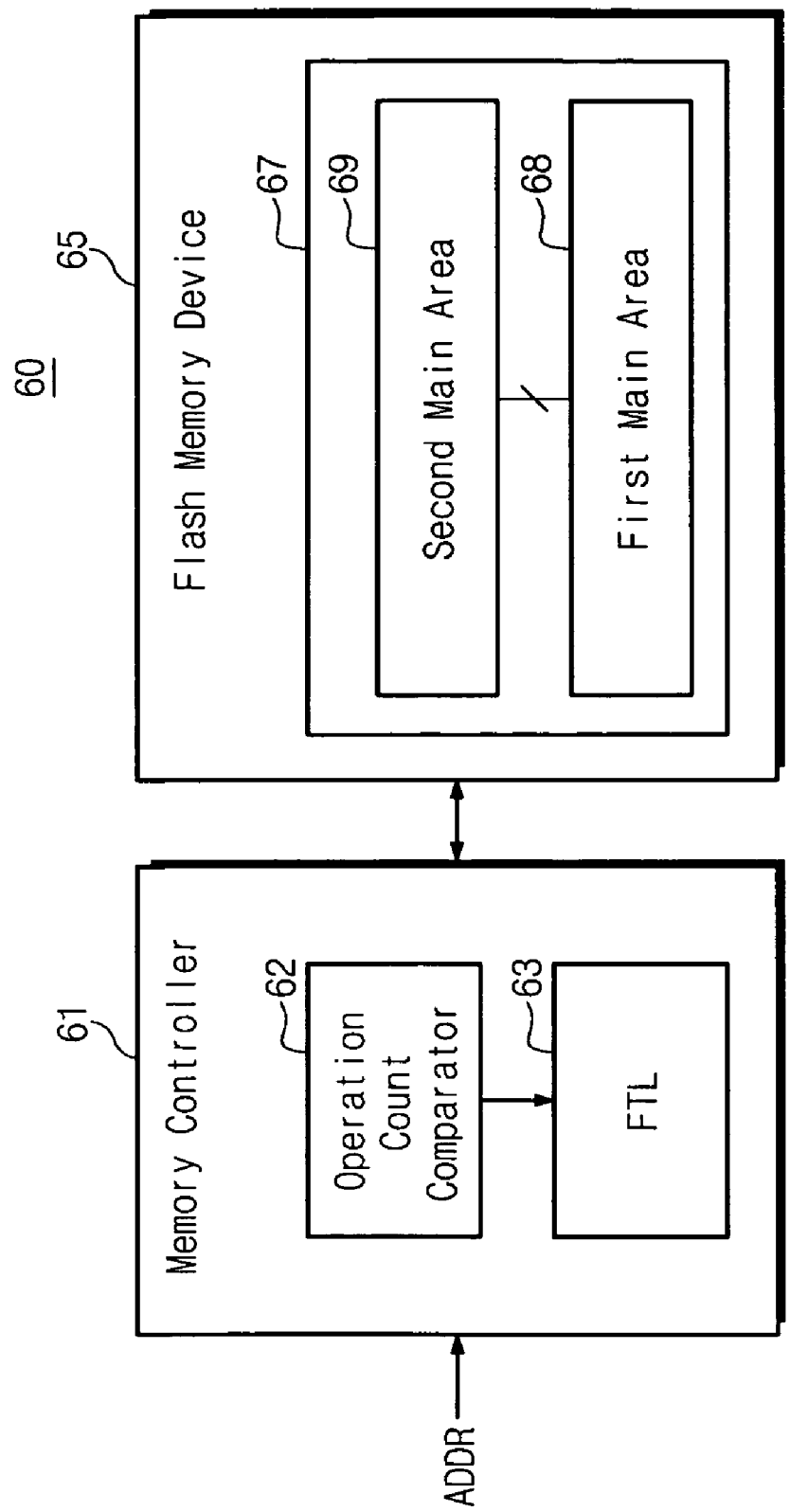
FIG. 14 illustrates a memory system according to still another embodiment of the present invention.

FIG. 14 illustrates a memory system 60 according to yet another embodiment of the present invention. Referring to FIG. 14, the memory system 60 may include a memory controller 61 and a flash memory device 65. The memory controller 61 may include an operation count comparator 62 and a FTL 63. The flash memory device 65 may include a main area 67. The main area 67 may include the first main area 68 and the second main area 69. Although not illustrated in FIG. 14, operation count information may be stored in a main area 67. For example, an operation count may be stored in a spare area of each word line of a first main area 68.

Figure 15:
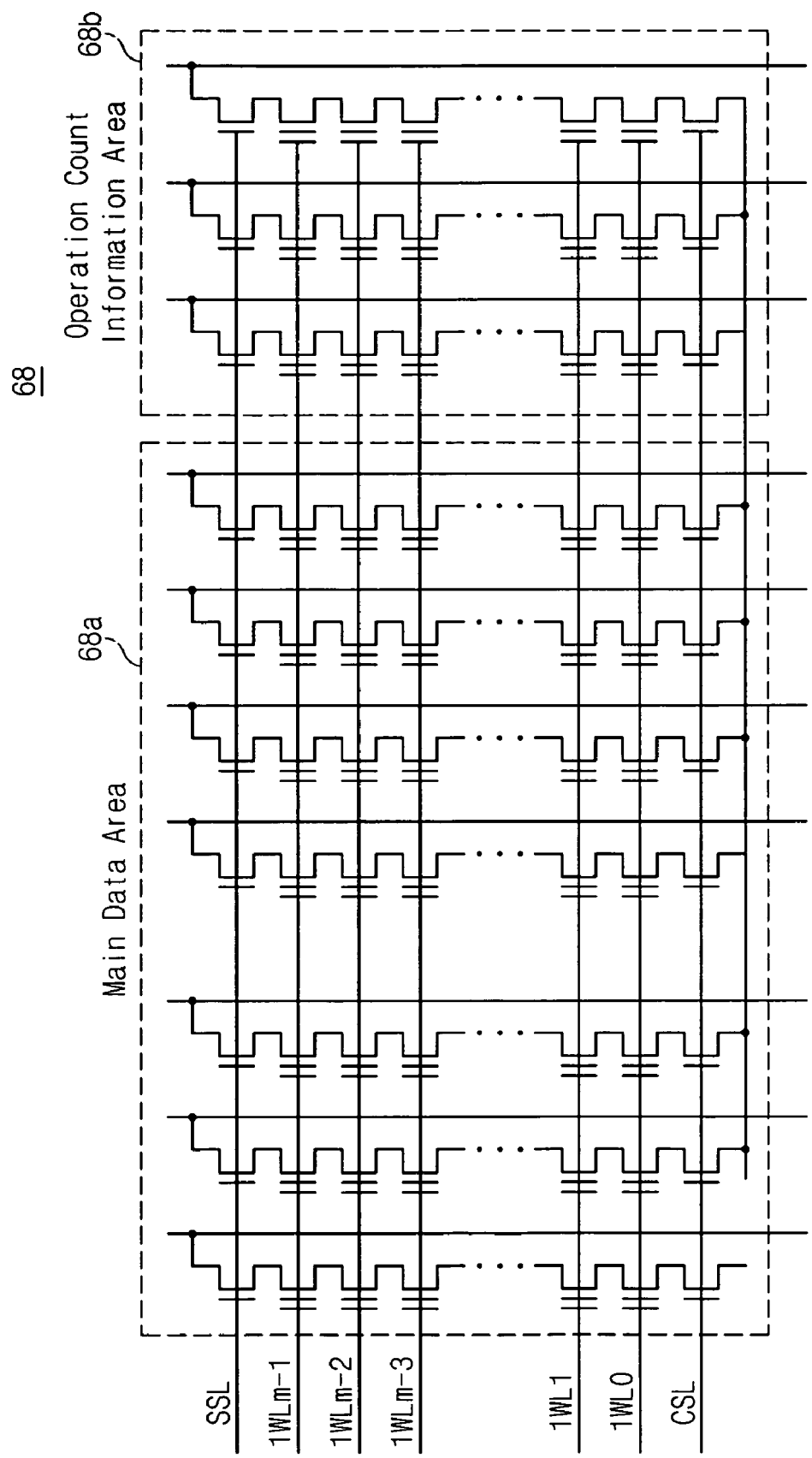
FIG. 15 illustrates an embodiment of a first main area illustrated in FIG. 14.

FIG. 15 illustrates an embodiment of the first main area 68 illustrated in FIG. 14. Referring to FIG. 15, the first main area 68 may include a main data area 68a storing user data and an operation count information area 68b storing operation count information. Each of word lines 1WL0 through 1WLm−1 may include memory cells for storing an operation count. Herein, if the operation count is a program count, a program operation count of each word line may be stored in the operation count information area 68b of each word line.

In the memory system of embodiments, a physical position converting operation of the semiconductor memory device may be performed periodically. In this case, the memory controller may periodically determine whether the address count is equal to or greater than the predetermined value, and convert mapping information according to the determination results.

Also, if the address count of the input address ADDR is equal to or greater than the predetermined value, the memory system of embodiments may use the address count information to retrieve a physical position that has the smallest address count in the semiconductor memory device. The memory controller may convert the physical position of the semiconductor memory device corresponding to the input address ADDR to the retrieved physical position with the smallest address count.

According to embodiments, the physical position converting operation of the semiconductor memory device may be performed only in a test mode, as discussed below.

Figure 16:
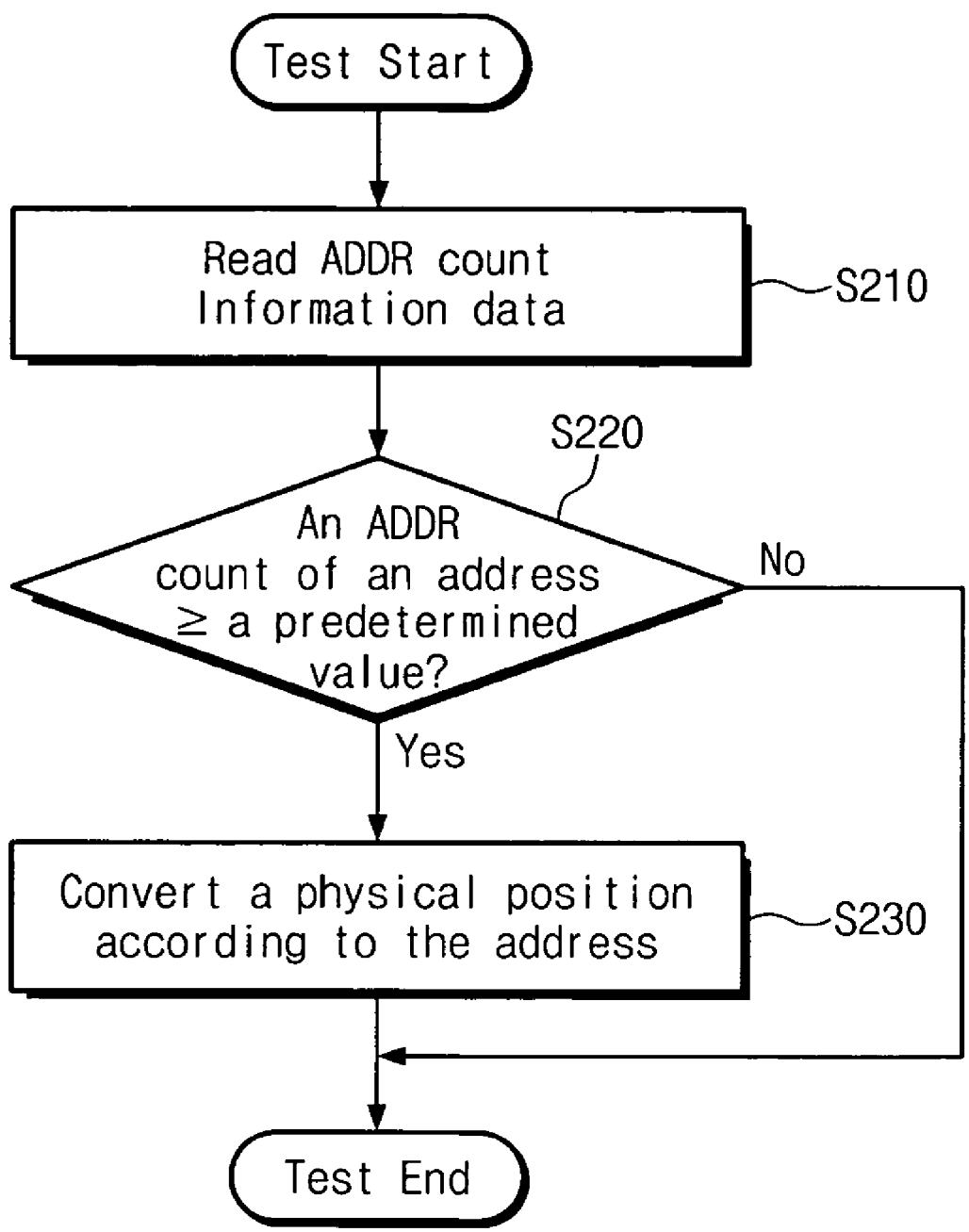
FIG. 16 illustrates a flow chart of a method for converting a physical position of a semiconductor memory device in a test mode according to an embodiment of the present invention.

FIG. 16 illustrates a flow chart of a method for converting a physical position of a semiconductor memory device in a test mode according to an embodiment of the present invention.

Referring to FIG. 16, when the semiconductor memory device enters a test mode, the memory controller may read address count information, in operation S210. In operation S220, the memory controller may determine whether an input count of an input address is equal to or greater than a predetermined value. If the input count of the input address is equal to or greater than the predetermined value, the memory controller may convert a physical position of the semiconductor memory device corresponding to the input address, in operation S230. At this point, the input count of the input address may be reset and stored. On the other hand, if the input count of the input address is less than the predetermined value, the test operation may be ended.

Figure 17:
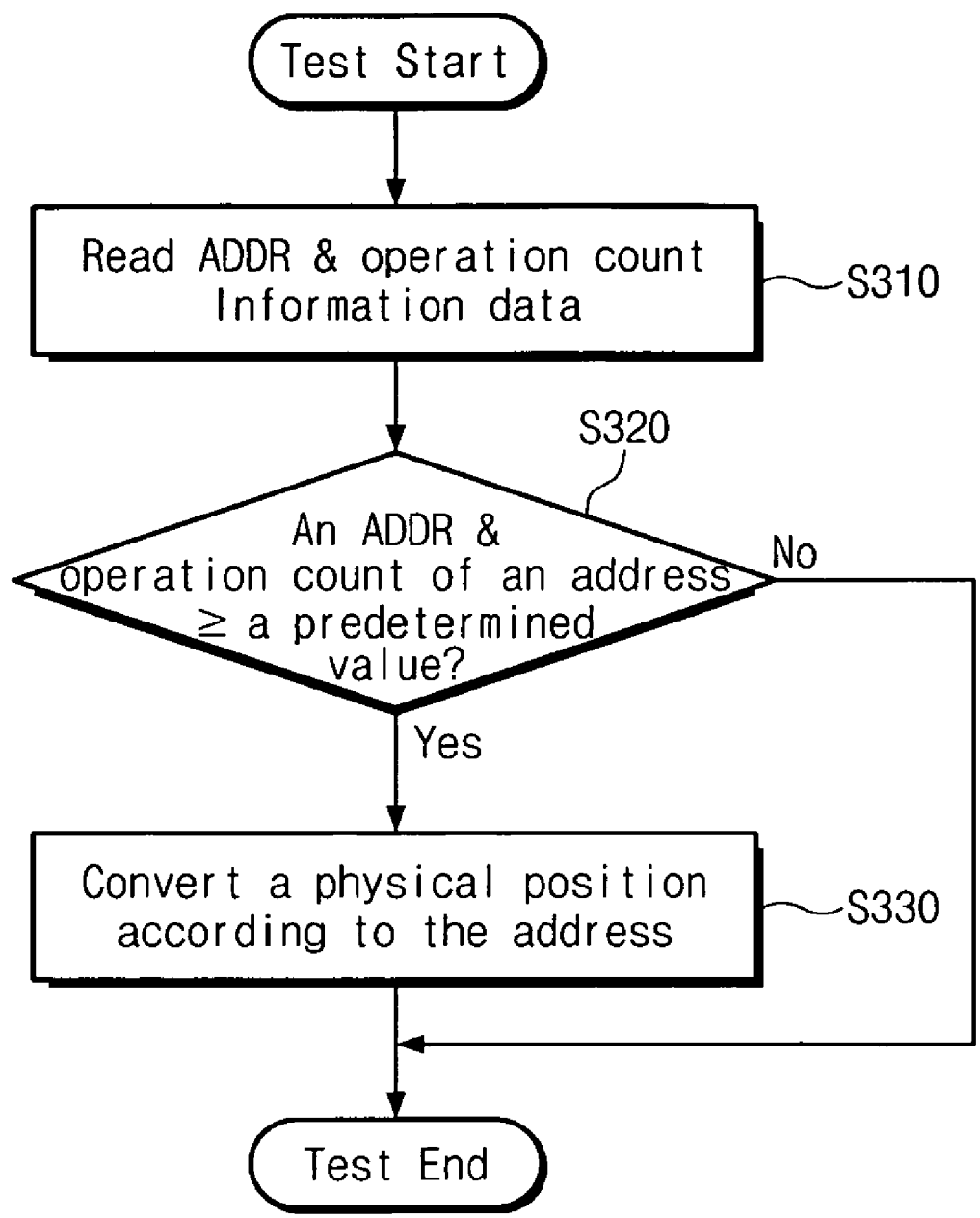
FIG. 17 illustrates a flow chart of a method for converting a physical position of a semiconductor memory device in a test mode according to another embodiment of the present invention.

FIG. 17 illustrates a flow chart of a method for converting a physical position of a semiconductor memory device in a test mode according to another embodiment of the present invention.

Referring to FIG. 17, when the semiconductor memory device enters a test mode, the memory controller may read operation count information of a physical position corresponding to an input address, in operation S310. In operation S320, the memory controller may determine whether the operation count is equal to or greater than a predetermined value. If the operation count is equal to or greater than the predetermined value, the memory controller may convert the physical position corresponding to the input address, in operation S330.

The physical position converting operation of the semiconductor memory device of embodiments may be performed only in a power-up mode, as discussed below.

Figure 18:
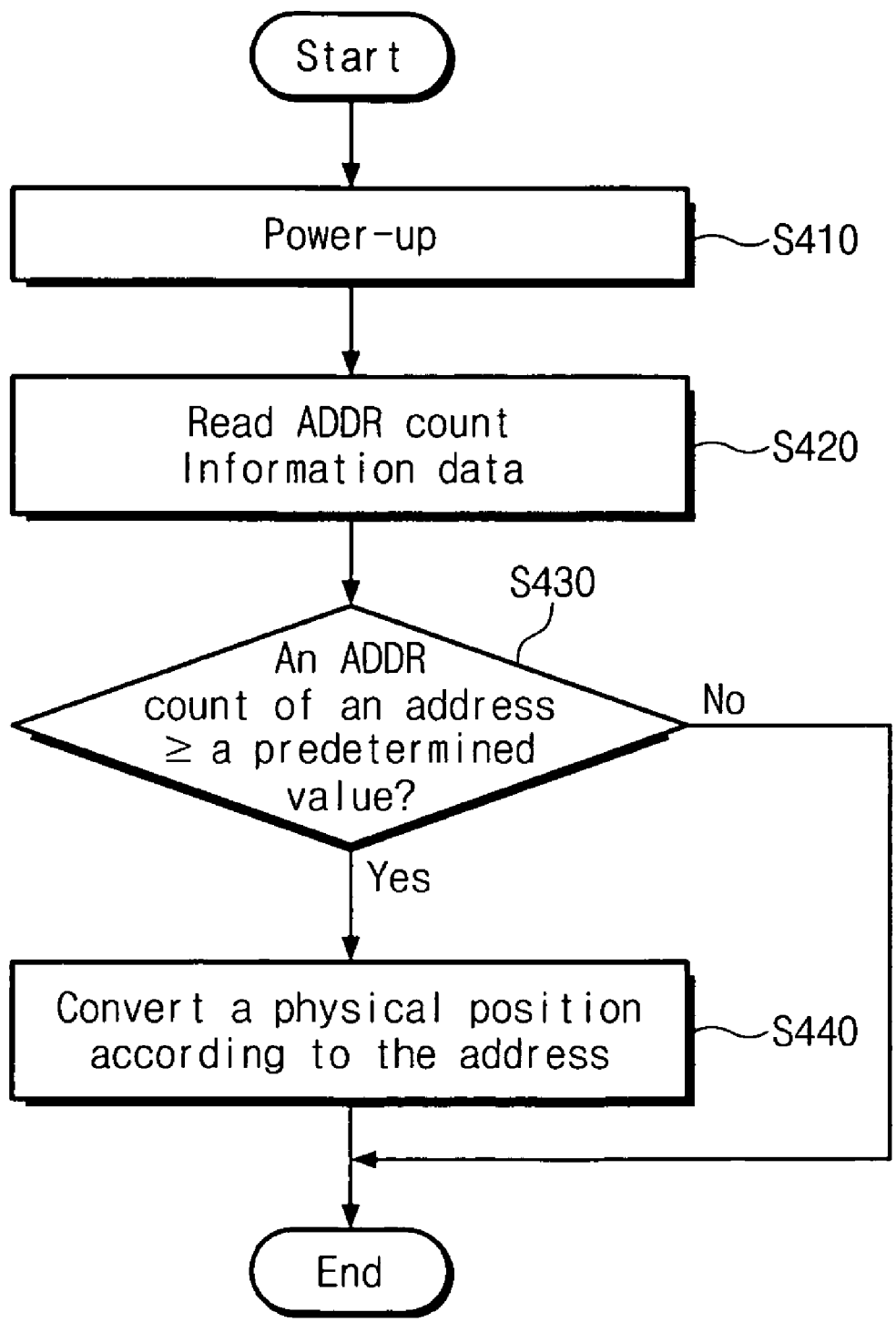
FIG. 18 illustrates a flow chart of a method for converting a physical position of a semiconductor memory device in a power-up mode according to an embodiment of the present invention.

FIG. 18 illustrates a flow chart of a method for converting a physical position of a semiconductor memory device in a power-up mode according to an embodiment of the present invention.

Referring to FIG. 18, the semiconductor memory device may be powered up in operation S410. In operation S420, the memory controller may read address count information. In operation S430, the memory controller may determine whether an input count of an input address is equal to or greater than a predetermined value. If the input count of the input address is equal to or greater than the predetermined value, the memory controller may convert a physical position of the semiconductor memory device corresponding to the input address. At this point, the input count of the input address may be reset and stored. If the input count of all the input addresses is less than the predetermined value, the test operation may be ended.

Figure 19:
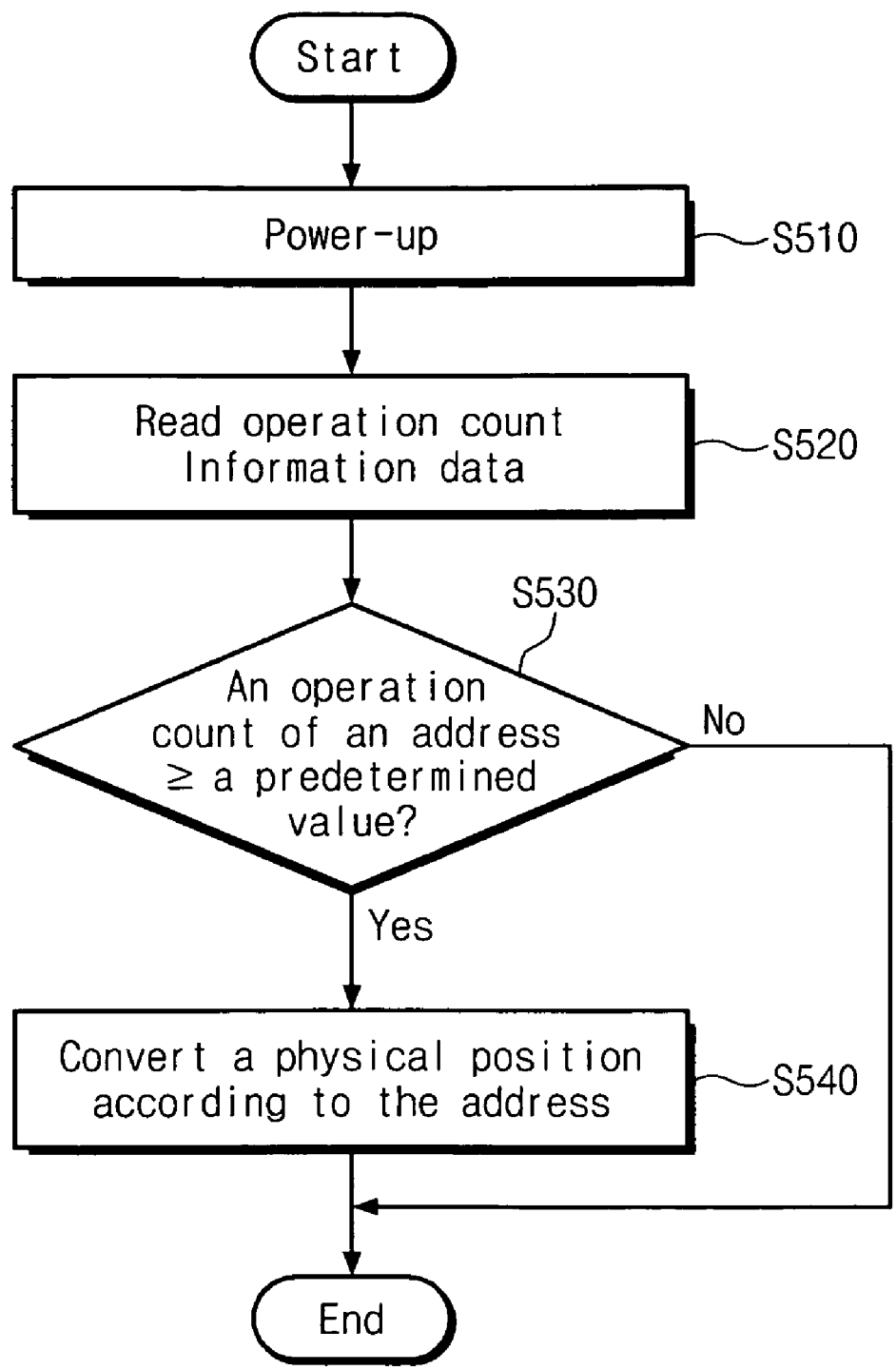
FIG. 19 illustrates a flow chart of a method for converting a physical position of a semiconductor memory device in a power-up mode according to another embodiment of the present invention.

FIG. 19 illustrates a flow chart of a method for converting a physical position of a semiconductor memory device in a power-up mode according to another embodiment of the present invention. In contrast to the method illustrated in FIG. 18, whether to convert a physical position is determined according to an operation count of a memory cell corresponding to an input address, rather than an input count of the input address. Otherwise, operations S510, S520 and S540 of FIG. 19 correspond to operations S410, S420, S440 of FIG. 18.

Figure 20:
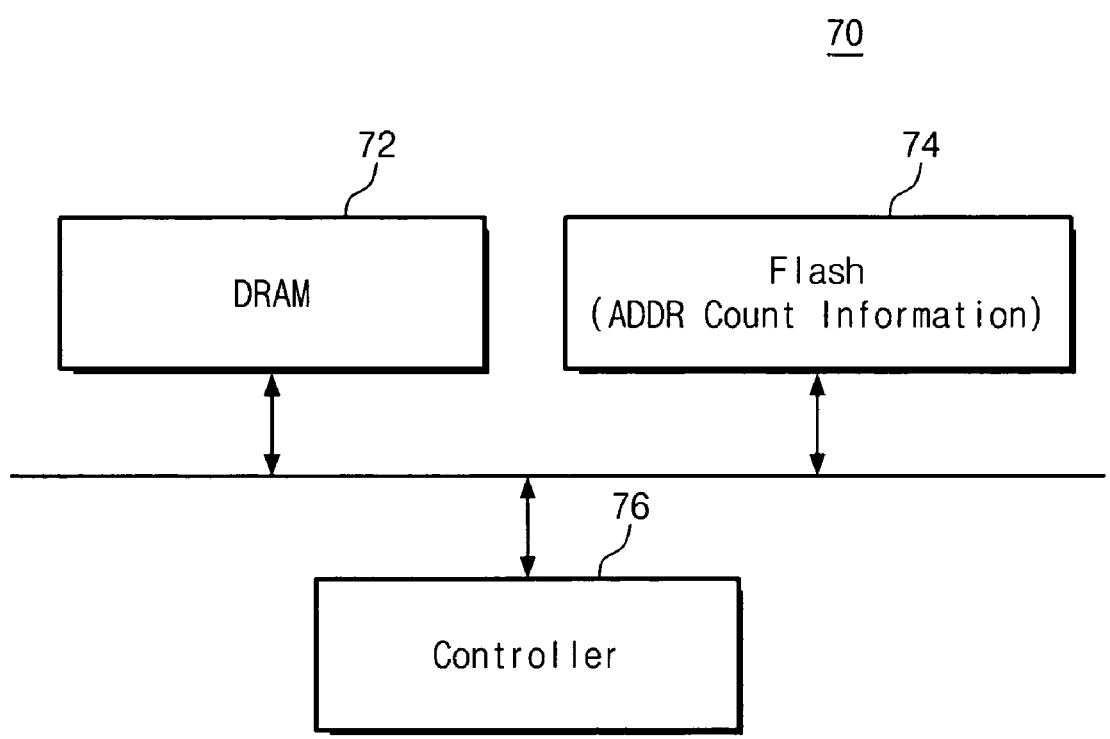
FIG. 20 illustrates a memory system according to yet another embodiment of the present invention.

FIG. 20 illustrates a memory system 70 according to further another embodiment of the present invention. Referring to FIG. 20, the memory system 70 may include a DRAM 72, a flash memory 74, and a controller 76.

The DRAM 72 may be configured to convert a physical position of a corresponding memory cell according to an address input count. The flash memory 74 may store information about the address input count. The controller 76 may control the DRAM 72 and the flash memory 74. In the present embodiment, the DRAM 72 may include the flexible address decoder 160 illustrated in FIG. 2. In another embodiment, the controller 76 may determine whether the address input count is equal to or greater than a predetermined value, and convert a physical position of a memory cell of the DRAM 72 corresponding to the input address.

Embodiments are also applicable to a OneNAND flash memory. The OneNAND flash memory has NOR-type I/O protocol externally, but includes a NAND flash memory core suitable for high integration, a high-speed buffer RAM, a register, and an error correction circuit (ECC), thereby intending to provide high-capacity, high-speed and high-stability memory performance.

FIG. 21 illustrates a OneNAND flash memory 80 according to an embodiment of the present invention. Referring to FIG. 21, the OneNAND flash memory 80 may include a host interface 81, a buffer RAM 82, a control logic 83, an internal register 84, and a NAND flash array 85.

The host interface 81 may be configured to exchange various data between devices using different protocol. The buffer RAM 82 may include a code for operating the OneNAND flash memory 80 and/or may store data temporarily. In response to an external control signal or command, the control logic 83 may control read, program and other modes of the OneNAND flash memory 80, and may control an error in data input/output to/from the OneNAND flash memory 80. The internal register 84 may store commands, addresses, and data, e.g., settings for defining the internal system operation environments of the OneNAND flash memory 80.

The NAND flash array 85 may include a first main area 86 and a second main area 87 whose use area is determined according to an address input count or an operation count. In particular, the OneNAND flash memory device 80 may be configured to convert a physical position corresponding to an input address from the first main area 86 to the second main area 87 if an input address count or an operation count is equal to or greater than a predetermined value.

Embodiments are also applicable to OneDRAM. The OneDRAM is a combined memory device that combines a DRAM and an SRAM that have different functions. The DRAM or the SRAM of the OneDRAM is configured to convert a physical position of a memory cell corresponding to an input address according to an address input count. For mobile products, the OneDRAM includes two DRAMs, i.e., a DRAM for a CPU controlling communication functions and another DRAM for another CPU controlling multimedia functions such as three-dimensional (3D) graphics and moving pictures. The OneDRAM integrates the two DRAMs used exclusively by the two CPUs, and variably controls a data flow while sharing inter-CPU data, thus increasing a data processing speed.

Embodiments are also applicable to Flex-OneNAND. The Flex-OneNAND is a third-generation fusion memory device capable of freely controlling the memory capacity and speed, which embodies a single-level cell (SLC) and a multi-level cell (MLC) in one chip. The Flex-OneNAND of the present invention is configured to convert a physical position corresponding to an input address according to an address input count or an operation count.

It will be readily understood that embodiments are not limited to semiconductor memory devices. For example, embodiments may also be applicable to any data storage device that performs address mapping. According to embodiments, the data storage device may be controlled so that the address count does not exceed a predetermined value.

The memory system of embodiments may be applicable to memory cards. Memory cards are used to store/read data, together with digital devices, e.g., digital cameras, portable audio devices, portable phones, and personal computers.

Also not illustrated in the drawings, those skilled in the art will readily understand that an application chipset, a camera image processor (CIS), a mobile DRAM, etc. may be added in the memory system of embodiments. For example, the memory system of embodiments may include a solid state driver/disk (SSD) that uses a nonvolatile memory device storing data.

The memory system according to embodiments may be mounted using various types of packages. For example, the memory system according to embodiments may be mounted using packages such as Package on Package (PoP), Ball grid arrays (BGAs), Chip scale package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

As described above, the decoders and the memory systems of embodiments may convert a physical position of a semiconductor memory device corresponding to an address according to the address count, thereby improving the reliability of the semiconductor memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory system, comprising:
   a semiconductor memory device including a first main area and a second main area; and
   a memory controller configured to control the semiconductor memory device, to detect whether an address count of an input address is equal to or greater than a predetermined value, and to determine whether a physical position of the semiconductor memory device corresponding to the input address is the first main area or the second main area.

2. The memory system as claimed in claim 1, wherein the first main area is a memory area used when the address count is less than the predetermined value and the second main area is a memory area used when the address count is equal to or greater than the predetermined value.

3. The memory system as claimed in claim 1, wherein the memory controller is configured to store address count information.

4. The memory system as claimed in claim 1, wherein the semiconductor memory device is a nonvolatile memory device and is configured to store address count information.

5. The memory system as claimed in claim 4, wherein the memory controller is configured to read, in a test mode, the address count information stored in the semiconductor memory device and to convert a physical position corresponding to an address whose address count is equal to or greater than the predetermined value.

6. The memory system as claimed in claim 4, wherein the memory controller is configured to read, in a power-up mode, the address count information stored in the semiconductor memory device and to convert a physical position corresponding to an address whose address count is equal to or greater than the predetermined value.

7. The memory system as claimed in claim 1, wherein the memory controller comprises:
   an address detector configured to detect whether the address count of the input address is equal to or greater than the predetermined value and to output detected results; and
   a physical position converter configured to convert the physical position corresponding to the input address from the first main area to the second main area according to the output of the address detector.

8. The memory system as claimed in claim 7, wherein the semiconductor memory device is a NAND flash memory, and the first main area and the second main area share a bit line.

9. The memory system as claimed in claim 8, wherein the address count comprises one of a program operation count, a read operation count, and an erase operation count.

10. The memory system as claimed in claim 9, wherein the memory controller is configured to perform wear leveling when the address count is equal to or greater than the predetermined value, wear leveling including converting the physical position corresponding to the input address into a non-operated physical position or a less-operated physical position.

11. The memory system as claimed in claim 9, wherein:
    the memory controller is configured to perform wear leveling when the address count is equal to or greater than a first use maintenance value, wear leveling including converting the physical position corresponding to the input address into a non-operated physical position or a physical position operated less than the first use maintenance value,
    when the address counts of all physical positions are equal to or greater than the first maintenance value and the address count corresponding to the input address is equal to or greater than a second maintenance value, wear leveling includes converting the physical position includes converting the physical position corresponding to the input address into a physical position operated less than the second use maintenance value,
    the first and second use maintenance values being less than a wear-out value of the physical position, and
    the second use maintenance value is greater than the first use maintenance value.

12. The memory system as claimed in claim 1, wherein the memory system is adapted to convert a physical position corresponding to the input address detected to have an address count equal to or greater than the predetermined value from the determined one of the first main area or the second main area to the other of the first main area or the second main area.

13. A method for converting a physical position of a semiconductor memory device, the semiconductor memory device including a first main area and a second main area, the method comprising:
    determining whether an address count of an input address is equal to or greater than a predetermined value; and
    determining whether a physical position of the semiconductor memory device corresponding to the input address is in the first main area or the second main area.

14. The method as claimed in claim 13, further comprising converting a physical position of the semiconductor memory device corresponding to the input address when the address count is equal to or greater than the predetermined value.

15. The method as claimed in claim 14, wherein converting the physical position of the semiconductor memory device corresponding to the input address includes converting the physical position corresponding to the input address from the determined one of the first main area or the second main area to the other of the first main area or the second main area.

16. The method as claimed in claim 14, further comprising:
    detecting a physical position with the smallest address count in the semiconductor memory device; wherein converting the physical position of the semiconductor memory device corresponding to the input address includes converting the physical position corresponding to the input address from the determined one of the first main area or the second main area to the detected physical position with the smallest address count.

* * * * *